United States Patent
Wu et al.

(10) Patent No.: US 12,191,379 B2
(45) Date of Patent: Jan. 7, 2025

(54) MULTI-GATE SEMICONDUCTOR DEVICE WITH INNER SPACER AND FABRICATION METHOD THEREOF

(71) Applicant: Taiwan Semiconductor Manufacturing Company, Ltd., Hsin-Chu (TW)

(72) Inventors: Bone-Fong Wu, Hsinchu (TW); Chih-Hao Yu, Tainan (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 732 days.

(21) Appl. No.: 17/371,968

(22) Filed: Jul. 9, 2021

(65) Prior Publication Data

US 2023/0010657 A1 Jan. 12, 2023

(51) Int. Cl.

| H01L 29/66 | (2006.01) |
|---|---|
| H01L 29/06 | (2006.01) |
| H01L 29/40 | (2006.01) |
| H01L 29/417 | (2006.01) |
| H01L 29/423 | (2006.01) |
| H01L 29/78 | (2006.01) |
| H01L 29/786 | (2006.01) |

(52) U.S. Cl.
CPC ...... *H01L 29/6681* (2013.01); *H01L 29/0653* (2013.01); *H01L 29/401* (2013.01); *H01L 29/41791* (2013.01); *H01L 29/42392* (2013.01); *H01L 29/66545* (2013.01); *H01L 29/66553* (2013.01); *H01L 29/66742* (2013.01); *H01L 29/7851* (2013.01); *H01L 29/78648* (2013.01)

(58) Field of Classification Search
None
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |

(Continued)

*Primary Examiner* — Scott B Geyer
(74) *Attorney, Agent, or Firm* — HAYNES AND BOONE, LLP

(57) ABSTRACT

A method of manufacturing a semiconductor device includes forming a fin structure in which first semiconductor layers and second semiconductor layers are alternatively stacked, the first and second semiconductor layers having different material compositions; forming a sacrificial gate structure over the fin structure; forming a gate spacer on sidewalls of the sacrificial gate structure; etching a source/drain (S/D) region of the fin structure, which is not covered by the sacrificial gate structure and the gate spacer, thereby forming an S/D trench; laterally etching the first semiconductor layers through the S/D trench, thereby forming recesses; selectively depositing an insulating layer on surfaces of the first and second semiconductor layers exposed in the recesses and the S/D trench, but not on sidewalls of the gate spacer; and growing an S/D epitaxial feature in the S/D trench, thereby trapping air gaps in the recesses.

20 Claims, 34 Drawing Sheets

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,954,058 B1* | 4/2018 | Mochizuki ........ H01L 29/42392 |
| 10,361,278 B2 | 7/2019 | Yang et al. |
| 11,398,550 B2* | 7/2022 | Lin ..................... H01L 29/0653 |
| 2016/0020305 A1* | 1/2016 | Obradovic .......... H01L 27/0688 |
| | | 438/157 |
| 2016/0359012 A1* | 12/2016 | Yu ................... H01L 21/823431 |
| 2017/0148897 A1* | 5/2017 | Cheng .................. H01L 27/124 |
| 2017/0194423 A1* | 7/2017 | Lin ................... H01L 21/32135 |
| 2018/0097059 A1* | 4/2018 | Bi ........................ H01L 29/401 |
| 2018/0204927 A1* | 7/2018 | Chanemougame ... H01L 21/845 |
| 2018/0331232 A1* | 11/2018 | Frougier ........... H01L 29/78618 |
| 2018/0358435 A1* | 12/2018 | Mochizuki .......... H01L 29/0673 |
| 2019/0067441 A1* | 2/2019 | Yang ................... H01L 29/4908 |
| 2019/0131431 A1 | 5/2019 | Cheng et al. |
| 2019/0157414 A1* | 5/2019 | Ando ............... H01L 21/02603 |
| 2019/0157444 A1* | 5/2019 | Yang ................... H01L 29/6681 |
| 2019/0305104 A1* | 10/2019 | Xie .................... H01L 29/4908 |
| 2020/0052086 A1* | 2/2020 | Yang ................... H01L 29/4991 |
| 2020/0126798 A1* | 4/2020 | Lin ........................ H01L 29/45 |
| 2020/0357911 A1* | 11/2020 | Frougier ........... H01L 29/42392 |
| 2020/0388694 A1* | 12/2020 | Cheng ................ H01L 29/6653 |
| 2020/0411667 A1* | 12/2020 | Wong ................ H01L 29/0653 |
| 2021/0391423 A1* | 12/2021 | Lin ................... H01L 29/42392 |
| 2022/0069078 A1* | 3/2022 | Yu ....................... H01L 29/0673 |
| 2024/0006514 A1* | 1/2024 | Wang ............... H01L 29/66439 |

* cited by examiner

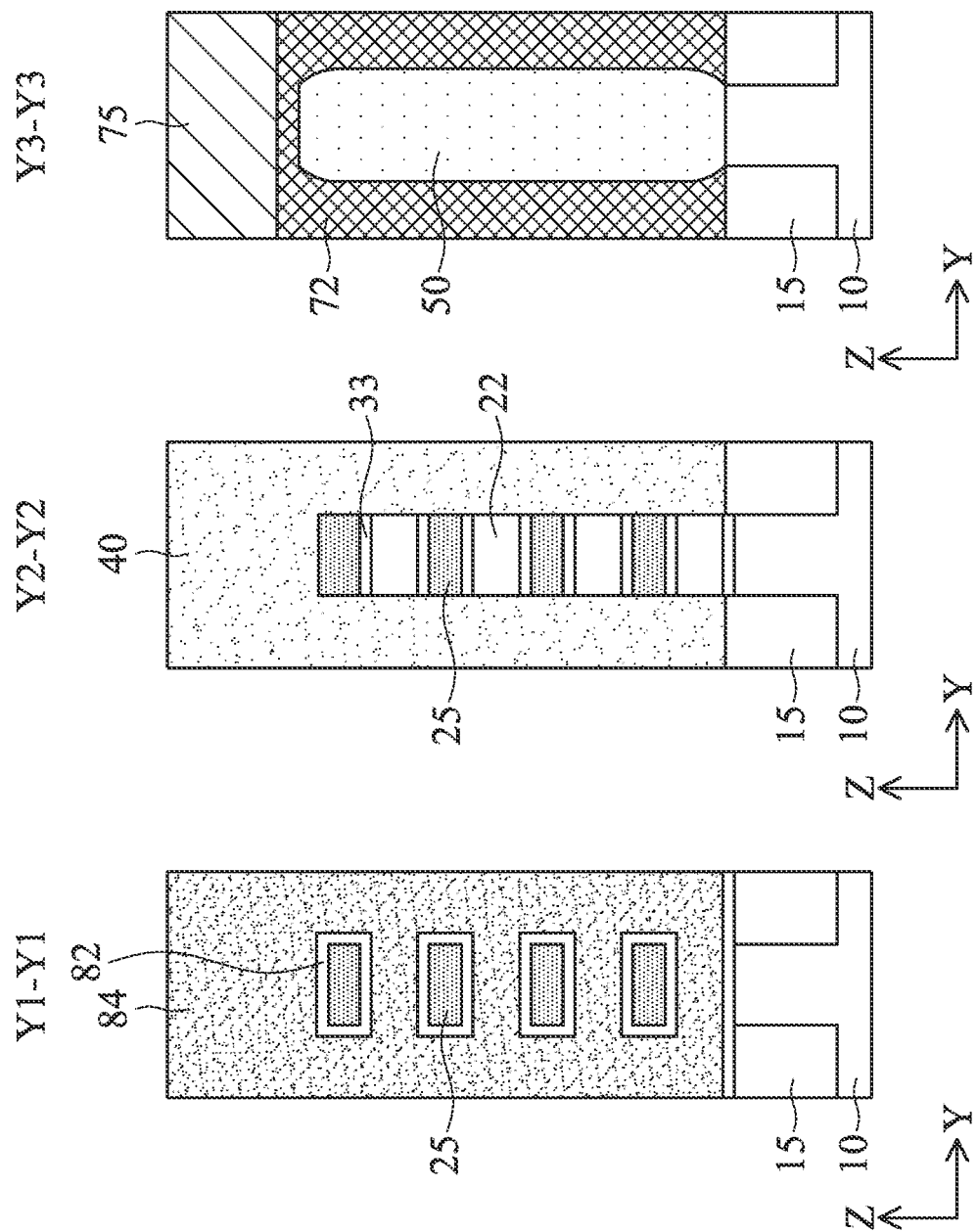

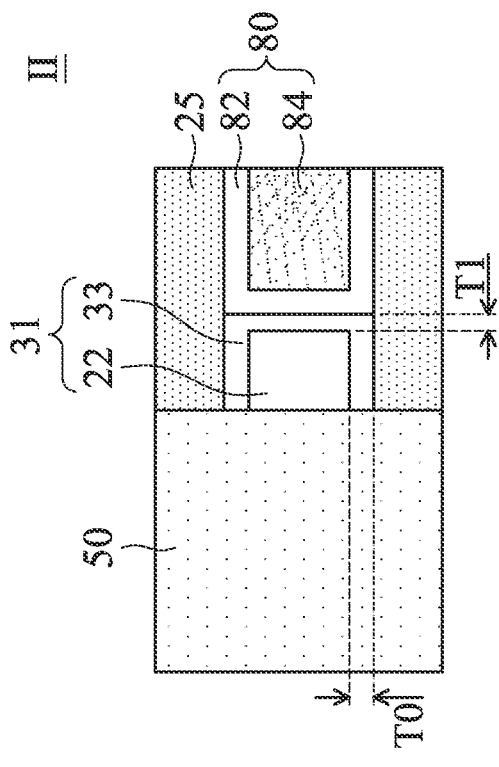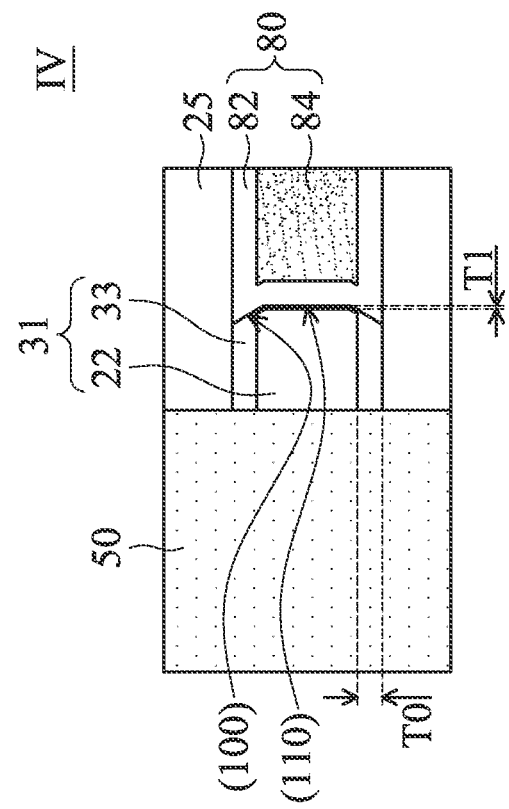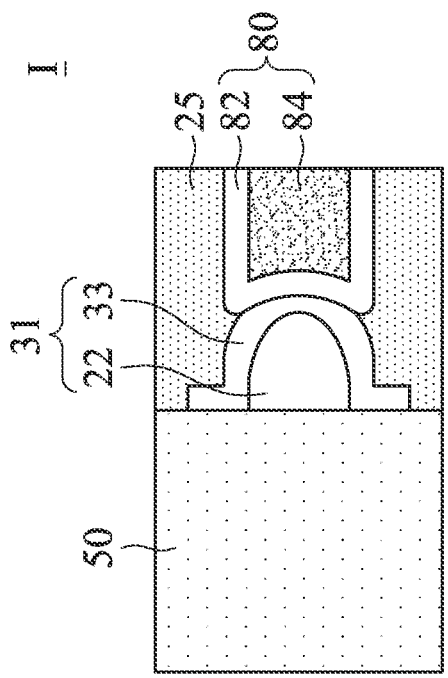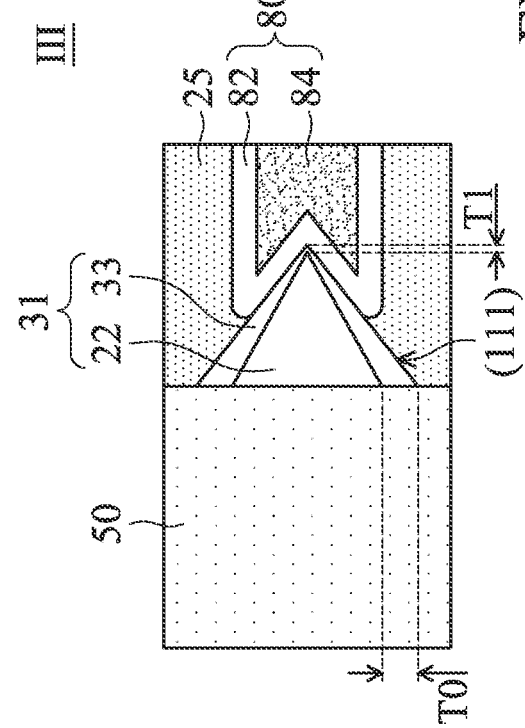
FIG. 2C

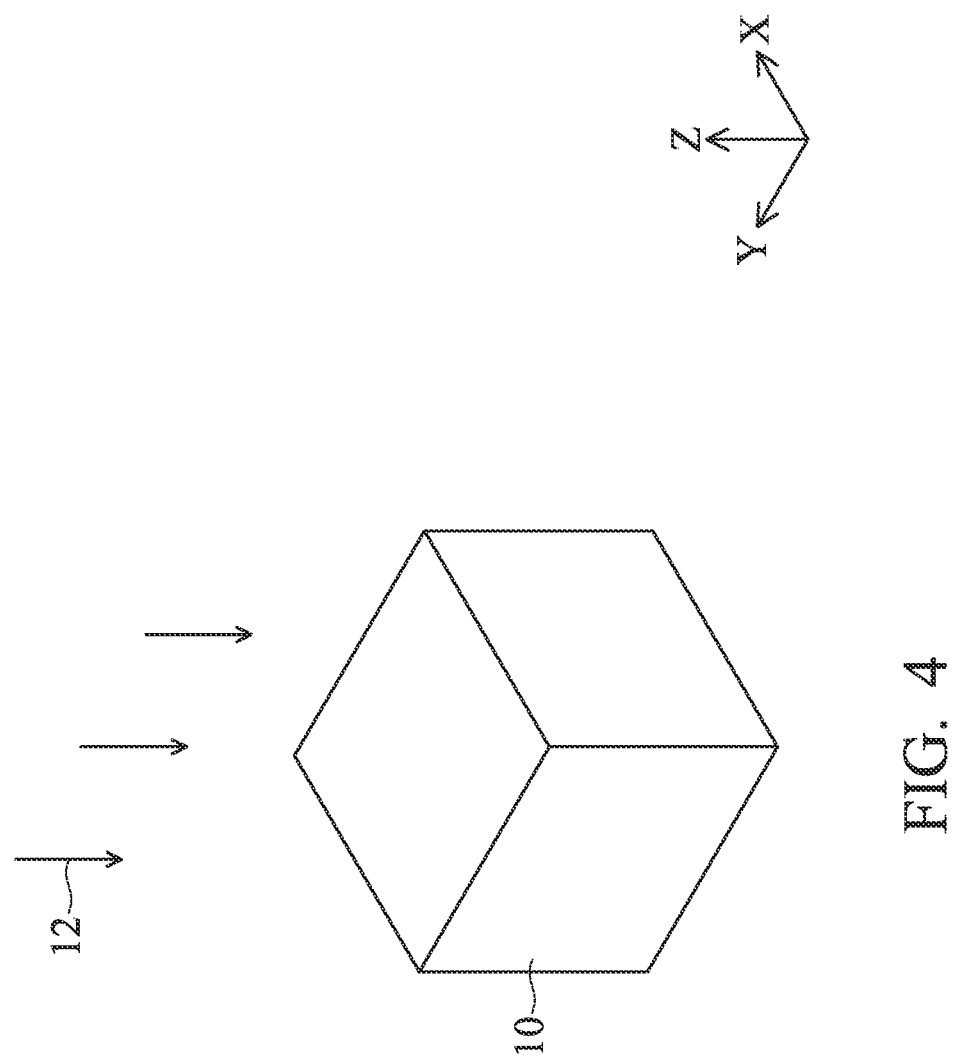

FIG. 11B  FIG. 11C  FIG. 11D

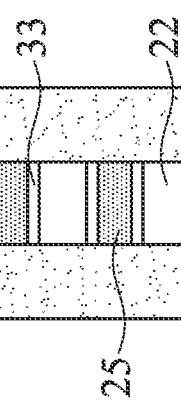
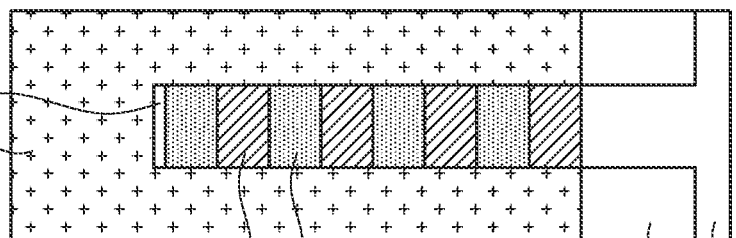
Y3-Y3
Y2-Y2
Y1-Y1
FIG. 13D
FIG. 13C
FIG. 13B

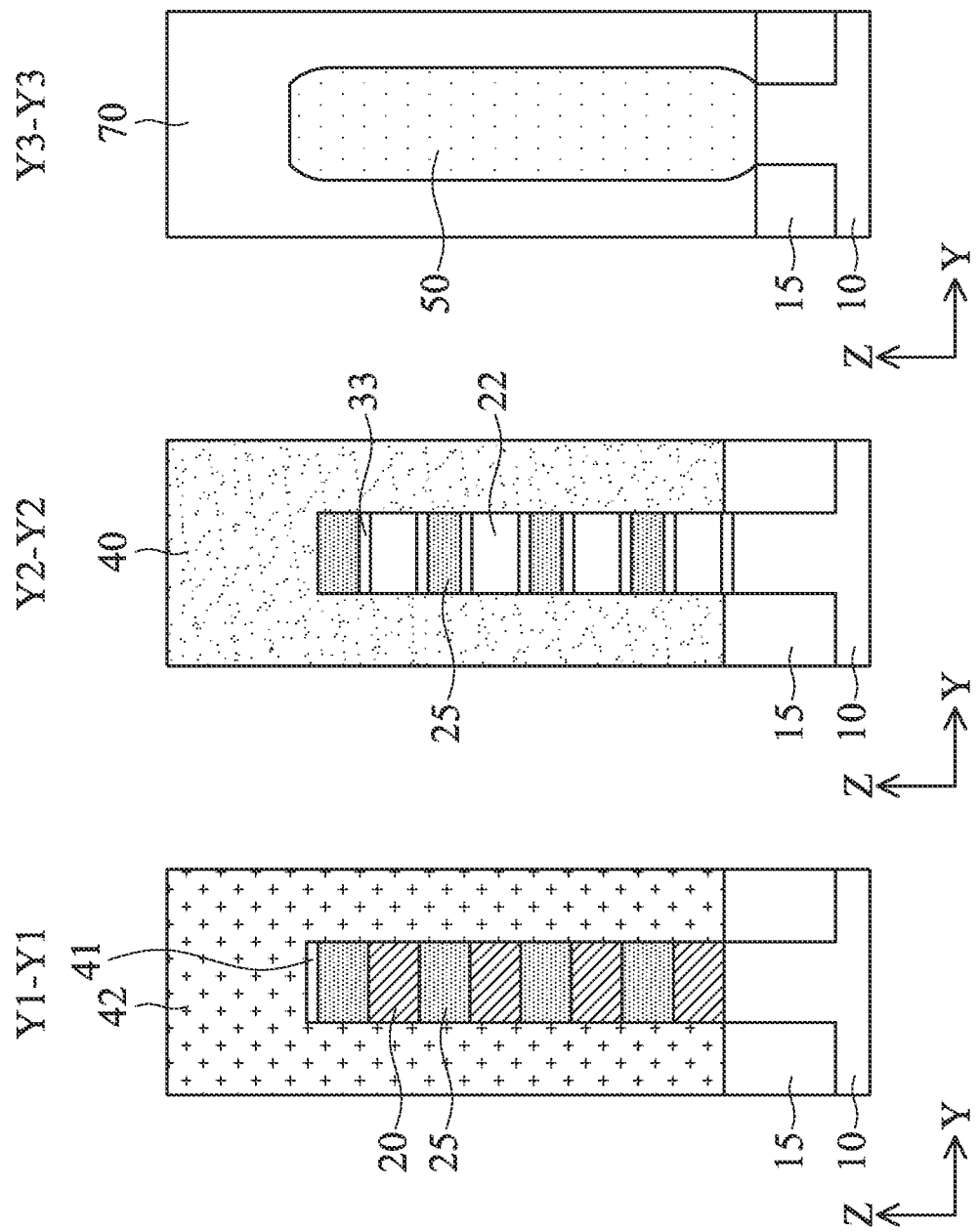

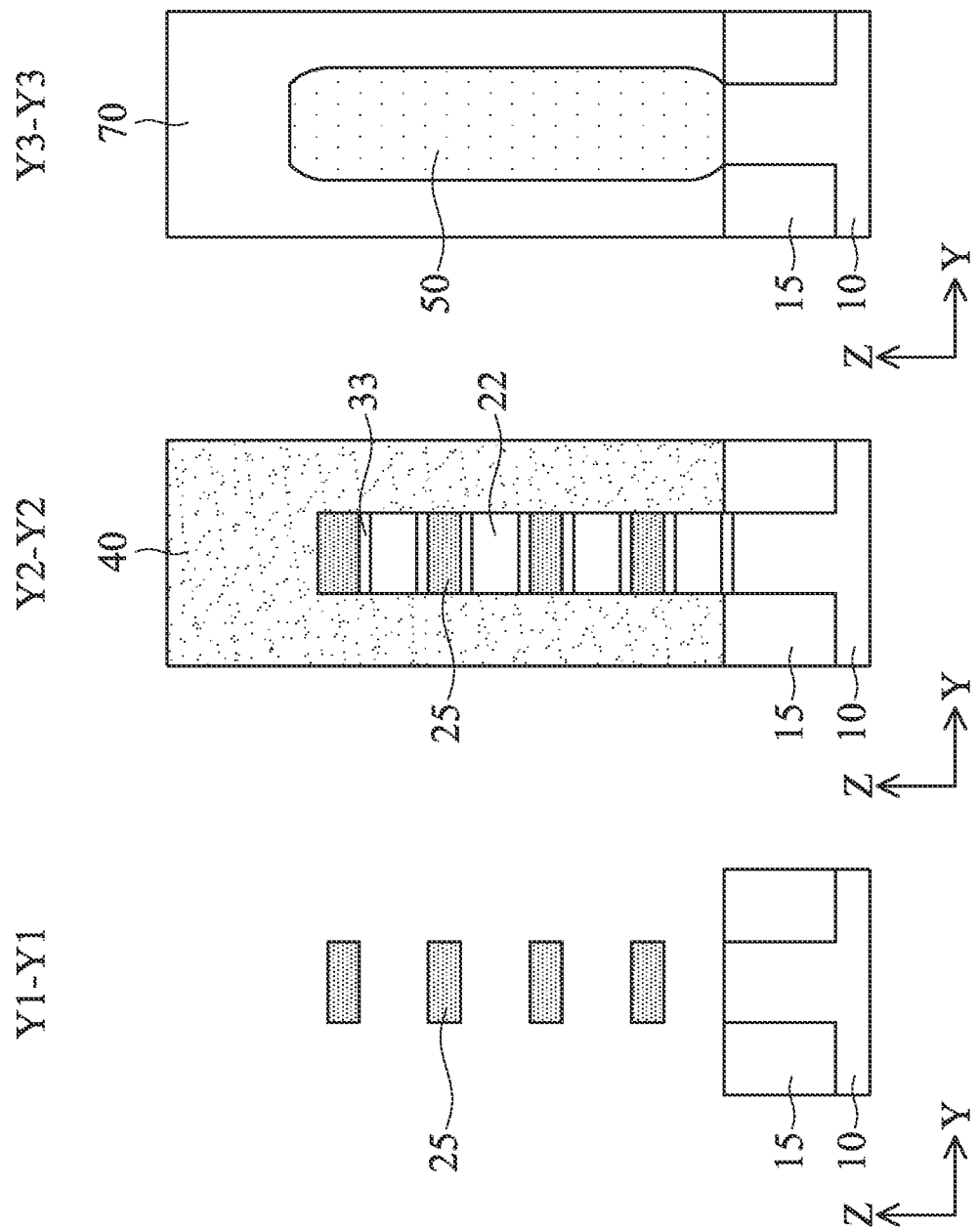

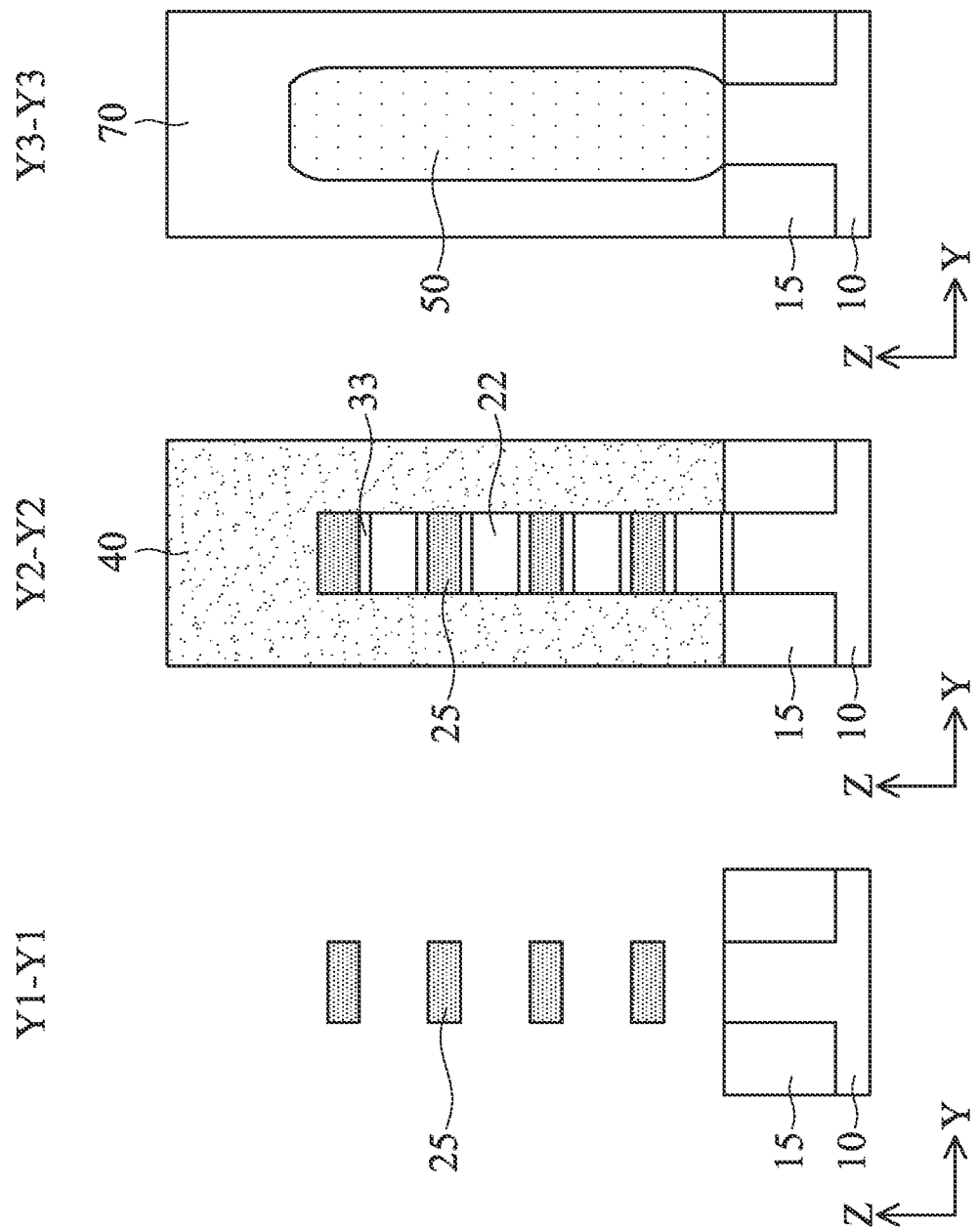

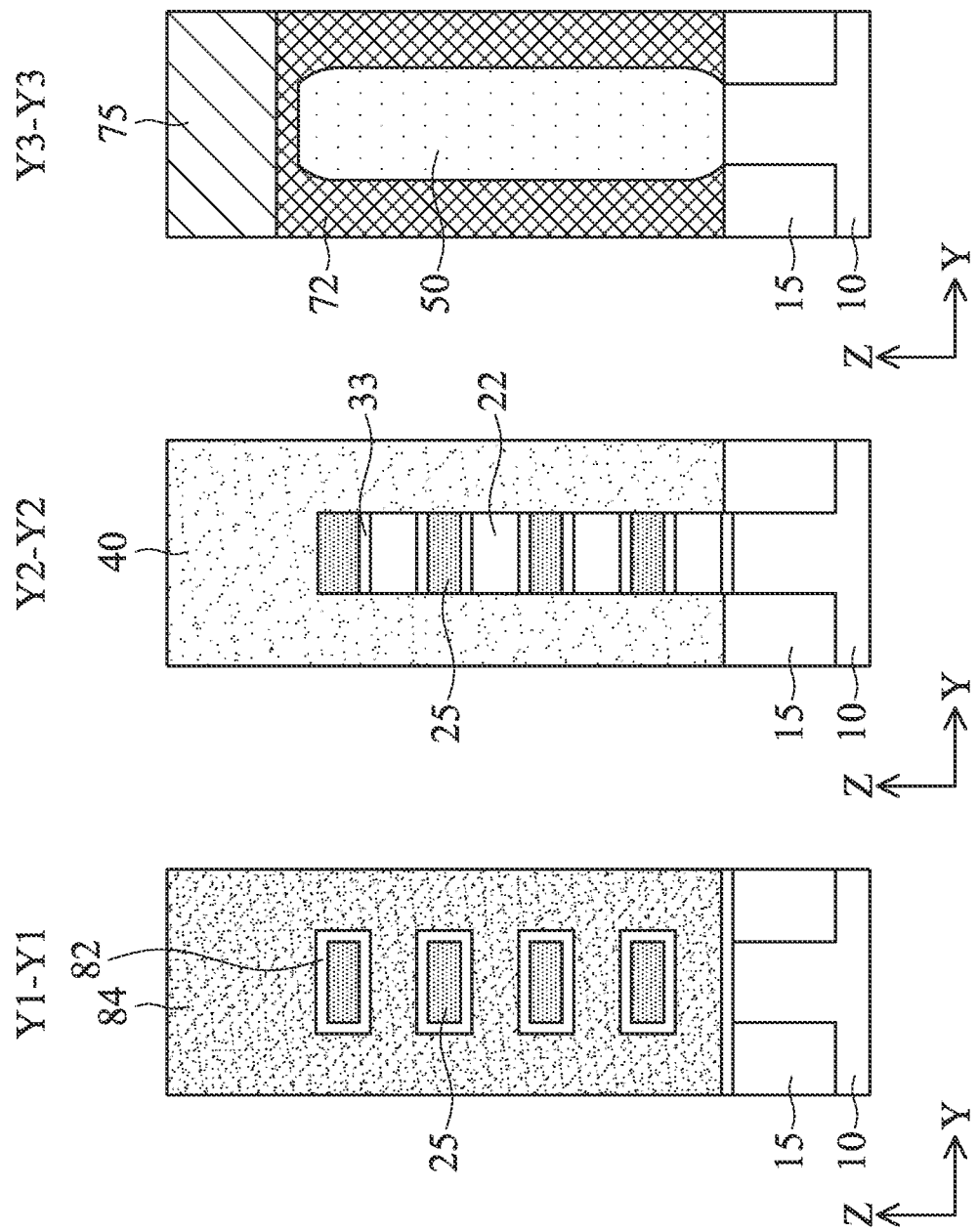

MULTI-GATE SEMICONDUCTOR DEVICE WITH INNER SPACER AND FABRICATION METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub-10 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, and 1D show various cross-sectional views of a semiconductor FET device, according to an embodiment of the present disclosure.

FIGS. 2A, 2B, and 2C show various configurations of inner spacer regions according to some embodiments of the present disclosure.

FIGS. 4, 5, 6, 7, 8, and 9 illustrate perspective views of a semiconductor structure during a fabrication process according to the method of FIGS. 3A and 3B, according to one or more aspects of the present disclosure.

FIGS. 10A, 10B, 10C, 10D, 11A, 11B, 11C, 11D, 12A, 12B, 12C, 12D, 13A, 13B, 13C, 13D, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, and 20D illustrate cross-sectional views of a semiconductor structure during a fabrication process according to the method of FIGS. 3A and 3B, according to some embodiments of the present disclosure.

DETAILED DESCRIPTION

Figure 1A:
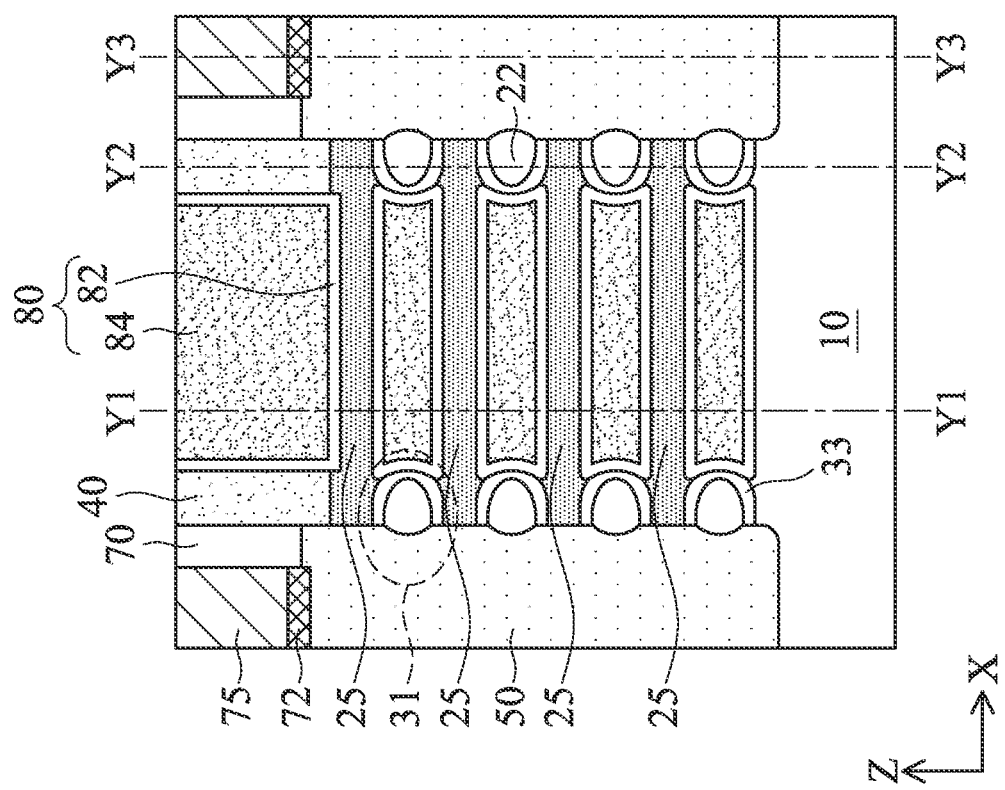

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating multi-gate devices with inner spacers having air gaps. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configuration associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

With transistor dimensions are continually scaled down to sub-10 nm technology nodes and below, it is generally desired to reduce stray capacitance among features of multi-gate transistors, such as capacitance between a gate structure and source/drain contacts, in order to increase switching speed, decrease switching power consumption, and/or decrease coupling noise of the transistors. Certain low-k materials (e.g., with a dielectric constant lower than that of silicon oxide) have been suggested as insulating materials, such as for inner spacers that interpose metal gate structures and source/drain (S/D) epitaxial features, for providing lower dielectric constant to reduce stray capacitance. However, as semiconductor technology progresses to smaller geometries, the etching loss of low-k materials in inner spacers during a replacement gate (or termed as "gate-last") process flow becomes unneglectable as it causes further reduced distance between the gate structure and source/drain contacts, leading to increased stray capacitance. Embodiments of the present disclosure offer advantages over the existing art, though it is understood that other embodiments may offer different advantages, not all advantages are necessarily discussed herein, and no particular advantage is required for all embodiments. In some embodiments of the present disclosure, inner spacers including air gaps for reducing effective dielectric constant and a high-k insulating layer that insulates the air gaps from leaking of gate structure materials into S/D regions are illustrated, which provides a benefit of reducing Cgd (gate-to-drain capacitance) and Cgs (gate-to-source capacitance) of multi-gate devices. Therefore, the speed of the circuit could be further improved. The high-k insulating layer also makes it possible to more precisely control the thickness, the shape, and/or the locations of the inner spacers and thus to improve device uniformity and yield rate.

In this disclosure, a source/drain (S/D) refers to a source and/or a drain. It is noted that in the present disclosure, a source and a drain are interchangeably used and the structures thereof are substantially the same.

FIGS. 1A-1D show various cross-sectional views of a semiconductor FET device according to an embodiment of the present disclosure. FIG. 1A is a cross-sectional view along the X direction (source-drain direction), FIG. 1B is a cross-sectional view corresponding to Y1-Y1 of FIG. 1A, FIG. 1C is a cross-sectional view corresponding to Y2-Y2 of FIG. 1A, and FIG. 1D shows a cross-sectional view corresponding to Y3-Y3 of FIG. 1A.

As shown in FIGS. 1A-1D, semiconductor channel members (e.g., nanowires or nanosheets) 25 are provided over a semiconductor substrate 10, and vertically arranged along the Z direction (the normal direction of the principal surface of the substrate 10). In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor channel members 25, which provides channel layers for the semiconductor FET device, are disposed over the substrate 10. The semiconductor channel members 25 may also be referred to as channel layers 25. In some embodiments, the channel layers 25 are disposed over a fin structure (not shown) protruding from the substrate 10. Although FIGS. 1A-1C show four channel layers 25, the number of the channel layers 25 is not limited to four, and may be as small as one or more than four and may be up to ten in some embodiments. Each of the channel layers 25 is wrapped around by a gate structure 80 that includes a gate dielectric layer 82 and a gate electrode layer 84. In some embodiments, the gate dielectric layer 82 includes an interfacial layer and a high-k dielectric layer. Sidewalls of the gate structure 80 are covered by a gate spacer 40. The gate spacer 40 includes one or more of silicon nitride (SiN), silicon oxynitride (SiON), and silicon carbonitride (SiCN), or any other suitable dielectric material.

Further, a source/drain (S/D) epitaxial feature 50 is disposed over the substrate 10. The S/D epitaxial feature 50 is in direct contact with the channel layers 25, and is separated from the gate dielectric layer 82 by the inner spacers 31. As shown FIG. 1A, the cross section along the X direction of the inner spacers 31 has a substantially dome-shape profile. As will be discussed in more detail below in association with FIGS. 2A-2C, the cross section along the X direction of the inner spacers 31 may have other shapes in various embodiments. Still referring to FIG. 1A, in some embodiments, each of the inner spacers 31 includes at least an air gap 22 and an insulating layer 33. The insulating layer 33 directly interfaces the gate dielectric layer 82 and is in contact with parts of lateral end portions of adjacent two channel layers 25. The insulating layer 33 interposes the S/D epitaxial feature 50 and the gate dielectric layer 82. In some embodiments, the insulating layer 33 is formed of a high-k dielectric material, for example, higher dielectric constant (k) than that of the gate spacer 40. In one example, the k value of the insulating layer 33 is between about 1.5 times to about 3 times of the k value of the gate spacer 40. The air gap 22 interposes the insulating layer 33 and the S/D epitaxial feature 50 and is stacked between adjacent two channel layers 25. As shown in FIG. 1C, a portion of the gate spacer 40 is also exposed in the air gap 22. State differently, the S/D epitaxial feature 50, the insulating layer 33, and the gate spacer 40 collectively define boundaries of the air gap 22.

An interlayer dielectric (ILD) layer 70 is disposed over the S/D epitaxial feature 50, a conductive contact layer 72 is disposed on the S/D epitaxial feature 50, and a conductive plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material.

Figure 2A:
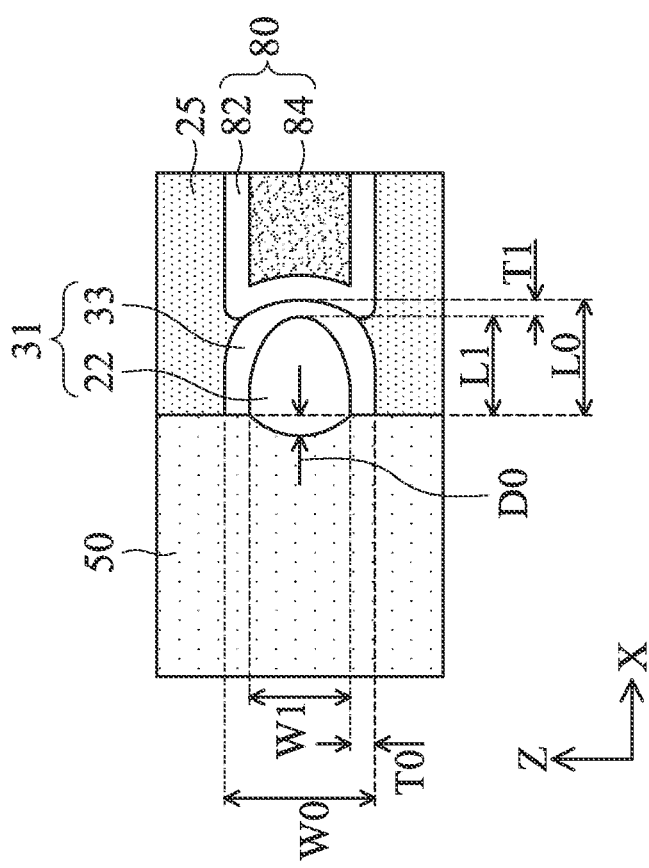

FIG. 2A shows an enlarged cross-sectional view of the inner spacer 31 taken from FIG. 1A. Also depicted in FIG. 2A are features in proximate region of the inner spacer 31, including portions of the S/D epitaxial feature 50, adjacent two channel layers 25, and the gate structure 80 (including gate dielectric layer 82 and the gate electrode layer 84).

The inner spacer 31 includes the air gap 22 and the insulating layer 33. As used herein, the term "air gap" is used to describe a void defined by surrounding substantive features, where a void may contain air, nitrogen, ambient gases, gaseous chemicals used during fabrication processes, or combinations thereof. In the illustrated embodiment, the air gap 22 occupies a large portion of the inner spacer 31 (e.g., >60% in volume). Compared with filling the air gap 22 with a low-k dielectric material (e.g., a dielectric constant less than that of the silicon oxide (~3.9)), in some embodiments, the air gap 22 is associated with a dielectric constant k≈1, which further reduces the overall effective dielectric constant of the inner spacer and thus stray capacitance in the device. The air gap 22 is stacked between adjacent two channel layers 25 but separated from the channel layers 25 by the insulating layer 33. In the X-direction, the air gap 22 extends laterally from the S/D epitaxial feature 50 to the insulating layer 33; in the Y-direction (see FIG. 1C), the air gap 22 extends laterally from a portion of the gate spacer 40 to an opposing portion of the gate spacer 40. In other words, the S/D epitaxial feature 50, the insulating layer 33, and the gate spacer 40 collectively define boundaries of the air gap 22.

The insulating layer 33 directly interfaces the gate dielectric layer 82 and is in contact with parts of lateral end portions of adjacent two channel layers 25. The insulating layer 33 also directly interfaces the S/D epitaxial feature 50, interposing the S/D epitaxial feature 50 and the gate dielectric layer 82. The insulating layer 33 functions as a capping layer or an etch stop layer to protect the air gap 22 from gate protrusion during metal gate formation processes. The term "gate protrusion" refers to a leakage of gate material (e.g., gate metal) through an inner spacer into an S/D epitaxial feature. In some embodiments, the insulating layer 33 is formed of a high-k dielectric material (e.g., a dielectric constant larger than that of the silicon oxide (~3.9)), such as in a range from about 5 to 8. To effectively against the gate protrusion, the insulating layer 33 may have a density in a range from about 2 g/cm³ to about 4 g/cm³. An insulating layer with a density outside this range may become less effective in against the gate protrusion. In furtherance of some embodiments, the insulating layer 33 is a nitrogen-containing compound doped with carbon. In one example, the insulating layer 33 includes silicon carbon oxynitride. In furtherance of the example, the insulating layer 33 is nitrogen-rich, meaning nitrogen has an atomic % larger than either oxygen or carbon in the compound. The nitrogen-rich compound with the existence of carbon increases etching resistivity (etching contrast) of the insulating layer 33. In a specific example, the insulating layer 33 includes silicon in atomic % from about 30% to about 50%, oxygen in atomic % from about 5% to about 15%, carbon in atomic % from about 5% to about 15%, nitrogen in atomic % from about 40% to about 60%. In yet another example, the insulating layer 33 is free of oxygen (e.g., SiCN, KN, HCN, or KSQ) to further increase etching contrast. In some alternative examples, the insulating layer 33 includes hafnium oxide (HfO₂), zirconium oxide (ZrO), or a combination thereof.

In yet some other embodiments, the insulating layer 33 is formed of a low-k dielectric material (e.g., a dielectric constant around or less than that of the silicon oxide (~3.9)) to effectively reduce stray capacitance, such as in a range from about 1.5 to 4. To effectively reduce stray capacitance, the insulating layer 33 may have a density in a range from about 1 g/cm³ to about 3 g/cm³. An insulating layer with a density outside this range may become less effective in reducing stray capacitance. In furtherance of some embodiments, the insulating layer 33 is an oxygen-containing compound doped with carbon. In one example, the insulating layer 33 includes silicon carbon oxynitride. In further-ance of the example, the insulating layer 33 is oxygen-rich, meaning oxygen has an atomic % larger than either nitrogen or carbon in the compound. In a specific example, the insulating layer 33 includes silicon in atomic % from about 30% to about 50%, oxygen in atomic % from about 40% to about 60%, carbon in atomic % from about 5% to about 15%, nitrogen in atomic % from about 10% to about 20%. In yet another example, the insulating layer 33 is free of nitrogen (e.g., SiCO, porous SiCO (SDON), or SiOF) to further reduce dielectric constant of the insulating layer.

Still referring to FIG. 2A, the illustrated inner spacer 31 has a dome-shaped profile having a larger base and a smaller apex. The apex of the dome-shape inner spacer 31 is oriented towards the gate structure 80. Further, the dome-shaped profile may include more than one apexes and include a concave portion between two apexes. A bottom edge of the base is defined at the interface between end portions of the insulating layer 33 and the S/D epitaxial feature 50, which may also substantially flush with the lateral ends (edges) of the channel layers 25 in some embodiments. Here, "substantially flush" means the difference in the relative positions is less than about 1 nm. In various embodiments, the inner spacer 31 has a length L0 ranging from about 2 nm to about 5 nm, which is measured from the bottom edge of the base to the apex of the insulating layer 33 that interfaces the gate dielectric layer 82; the inner spacer 31 has a width W0 ranging from about 7 nm to about 12 nm, which is measured between sidewalls of the insulating layer 33 that interface neighboring two channel layers 25. The air gap 22 has a length L1 ranging from about 1 nm to about 4 nm, which is measured from the bottom edge of the base to the apex of the air gap 22; the air gap 22 has a width W1 ranging from about 6 nm to about 11 nm, which is measured between two opposing sidewalls of the insulating layer 33.

The insulating layer 33 has two portions, a first portion in contact with the channel layer 25 and a second portion in contact with the gate structure 80. The first portion is conformally disposed on the lateral ends of the channel layer 25. The first portion has a thickness T0 ranging from about 1 nm to about 3 nm in some embodiments. The second portion has a thickness T1 that is smaller than T0, such as about 1 nm thinner. T1 ranges from about 0.1 nm to about 2 nm, in some embodiments. Due to the dome-shape, the second portion may have a varying thickness transiting from T0 to the smallest thickness T1 positioned at the apex. The thinner second portion reduces amount of high-k dielectric material in the inner spacer 31 and further reduces effective dielectric constant thereof.

Still referring to FIG. 2A, a portion of the illustrated air gap 22 protrudes laterally beyond the bottom edge of the base of the inner spacer 31 and into the S/D epitaxial feature 50. During the forming of the S/D epitaxial feature 50, lateral ends of the channel layers 25 functionally serve as a seed layer facilitating the epitaxial growth of semiconductor material to form the S/D epitaxial feature 50. If the growth rate is tuned high, the semiconductor material growing from the lateral ends of the neighboring two channel layers 25 may merge faster and seal the air gap 22 quicker, forming a concave surface of the semiconductor material exposed in the air gap 22 that bends away from the gate structure 80. The protruding distance D0 ranges from about 0.5 nm to about 1 nm in some embodiments.

Figure 2B:
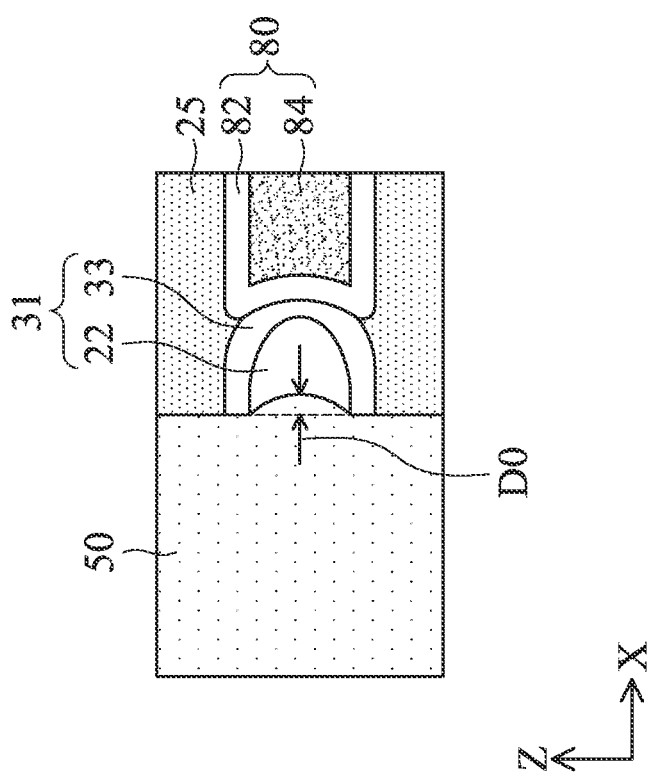

FIG. 2B illustrates an alternative embodiment of the inner spacer 31. The illustrated inner spacer 31 is similar to what has been depicted in FIG. 2A, including material compositions, profile, and dimensions. One difference is that a portion of the S/D epitaxial feature 50 protrudes laterally beyond the bottom edge of the base of the inner spacer 31 and into the air gap 22. This may be due to a relatively slow growth rate during the forming of the S/D epitaxial feature 50, such that epitaxially grown semiconductor material extends into the air gap 22 before sealing the air gap 22, thereby forming a convex surface of the semiconductor material exposed in the air gap 22 that bends towards the gate structure 80. The protruding distance DO ranges from about 0.5 nm to about 1 nm in some embodiments.

FIG. 2C includes alternative or additional embodiments of the inner spacer 31. In various embodiments in FIGS. 2A-2C, the similarity includes that the insulating layer 33 has substantially a U-shape (90 degree rotated) cross section and surrounds lateral ends of the channel layers 25, and the air gap 22 is located at an S/D side and in contact with the S/D epitaxial feature 50. Further, the various embodiments of the inner spacers 31 illustrated in FIG. 2C are similar to what has been depicted in FIG. 2A regarding material compositions and dimensions, such as a larger thickness T0 of the first portion of the insulating layer 33 and a narrower thickness T1 of the second portion of the insulating layer 33. One difference between the embodiments in FIG. 2C and FIG. 2A is the profile of the inner spacer 31. Example I in FIG. 2C shows a hat-shape profile that includes the dome-shape profile and a brim-shaped portion vertically disposed vertically on the lateral ends of the channel layers 25. Example II in FIG. 2C shows the inner spacer 31 with a rectangular cross section. Example III in FIG. 2C shows the inner spacer 31 with a triangular cross section with (111) facets. Example IV in FIG. 2C shows the inner spacer 31 with open-octangle-shape cross section with (100) and (110) facets. The different profiles are mainly due to different crystalline orientation of semiconductor materials. By appropriately selecting the principal surface crystalline orientation of the substrate 10 and/or types of etching solutions used to form recesses for depositing inner spacers therein, the cross-sectional profile of the inner spacers 31 can be designed for specific purposes in various embodiments.

Although a boundary of the air gaps 22 in FIG. 2C are depicted as flushing (coplanar) with lateral ends of the channel layers 25, it can either extend into the S/D epitaxial feature 50 as in FIG. 2A, or bends towards the gate structure 80 as in FIG. 2B, and vice versa the boundary of the air gap 22 in FIG. 2A or 2B may flush with lateral ends of the channel layer 25.

Figure 3A:
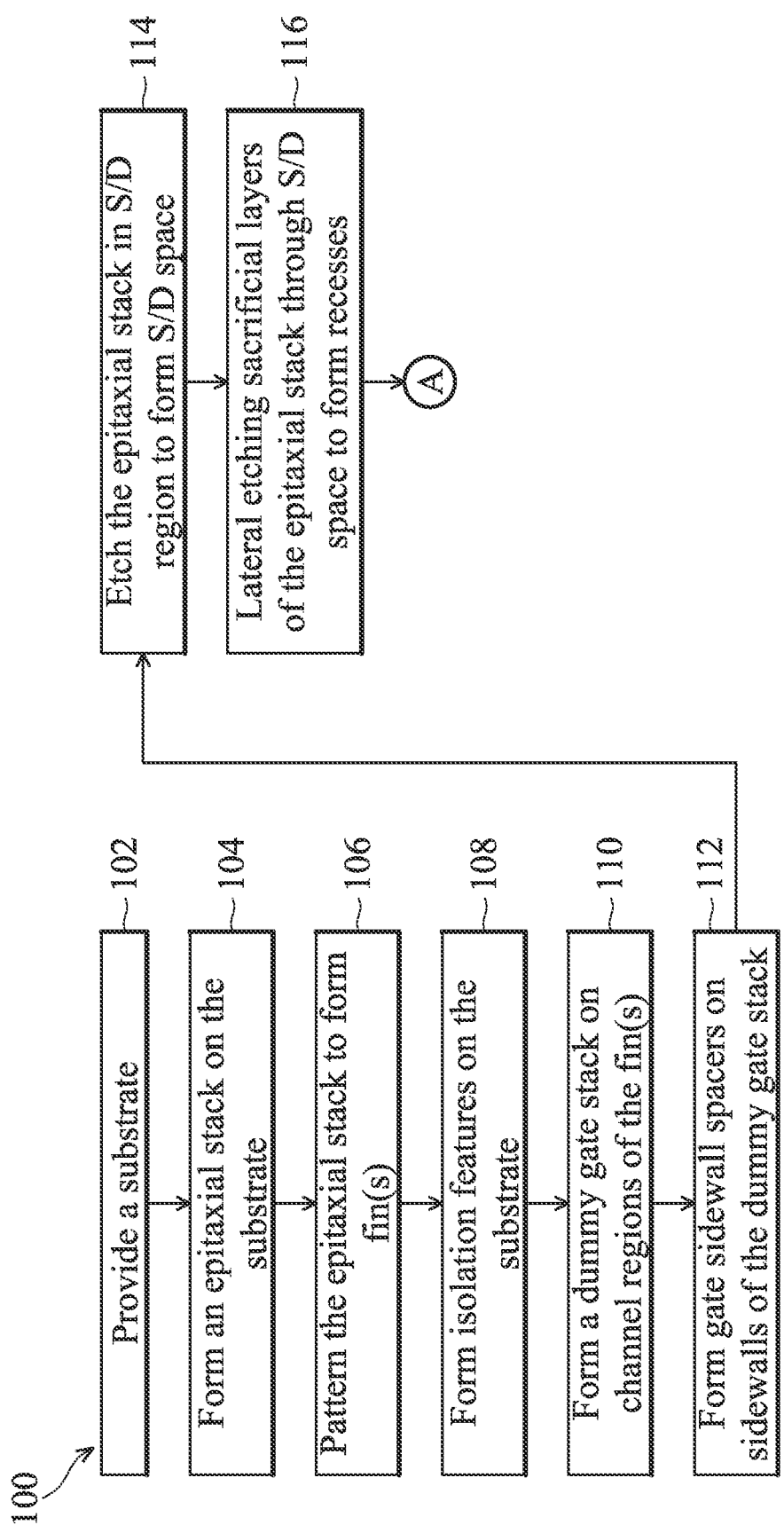
FIGS. 3A and 3B show a flow chart of a method for forming a semiconductor FET device, according to one or more aspects of the present disclosure.
Figure 3B:
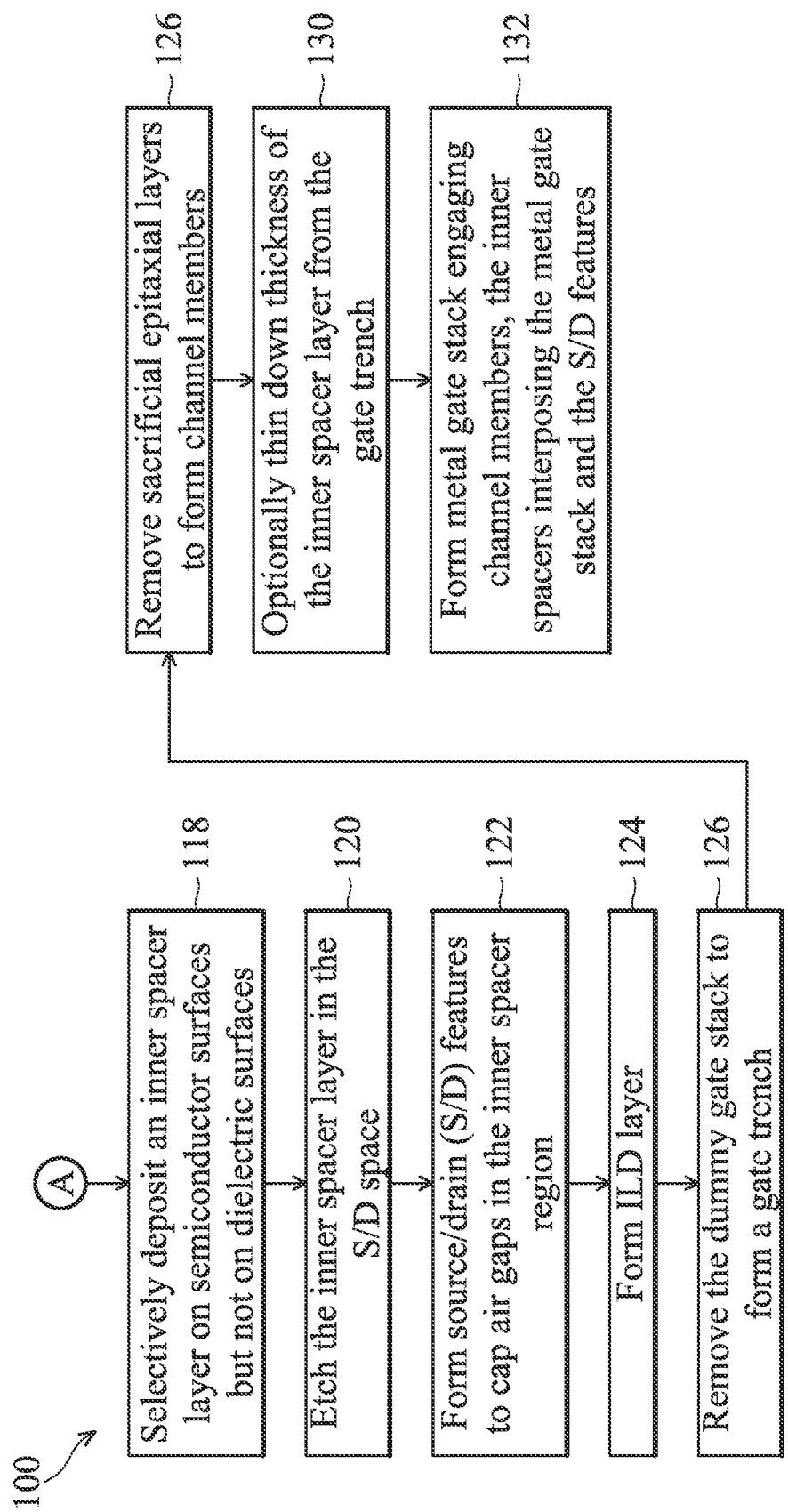

Illustrated in FIGS. 3A and 3B is a method 100 of semiconductor fabrication including fabrication of multi-gate devices. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 4-20D. FIGS. 4-9 are perspective views of an embodiment of a semiconductor FET device according to various stages of the method 100 of FIGS. 3A and 3B. FIGS. 10A-20D are cross-sectional views of embodiments of the semiconductor FET device according to various stages of the method 100 of FIGS. 3A and 2B, where figures numbered with suffix "A" represent a cross-sectional view along the X direction (source-drain direction), figures numbered with suffix "B" represent a cross-sectional view corresponding to Y1-Y1 cut of the respective figure numbered with suffix "A", figures numbered with suffix "C" represent a cross-sectional view corresponding to Y2-Y2 cut of the respective figures numbered with suffix "A", and figures numbered with suffix "D" represent a cross-sectional view corresponding to Y3-Y3 cut of the respective figures numbered with suffix "A".

Referring to FIG. 4, at operation 102, the method 100 (FIG. 3A) provides (or is provided with) a substrate 10. Impurity ions (dopants) 12 are implanted into the substrate 10 to form a well region. The ion implantation is performed to prevent a punch-through effect. The substrate 10 may include various regions that have been suitably doped with impurities (e.g., p-type or n-type conductivity). The dopants 12 are, for example boron ($BF_2$) for an n-type FinFET and phosphorus for a p-type FinFET.

Figure 5:
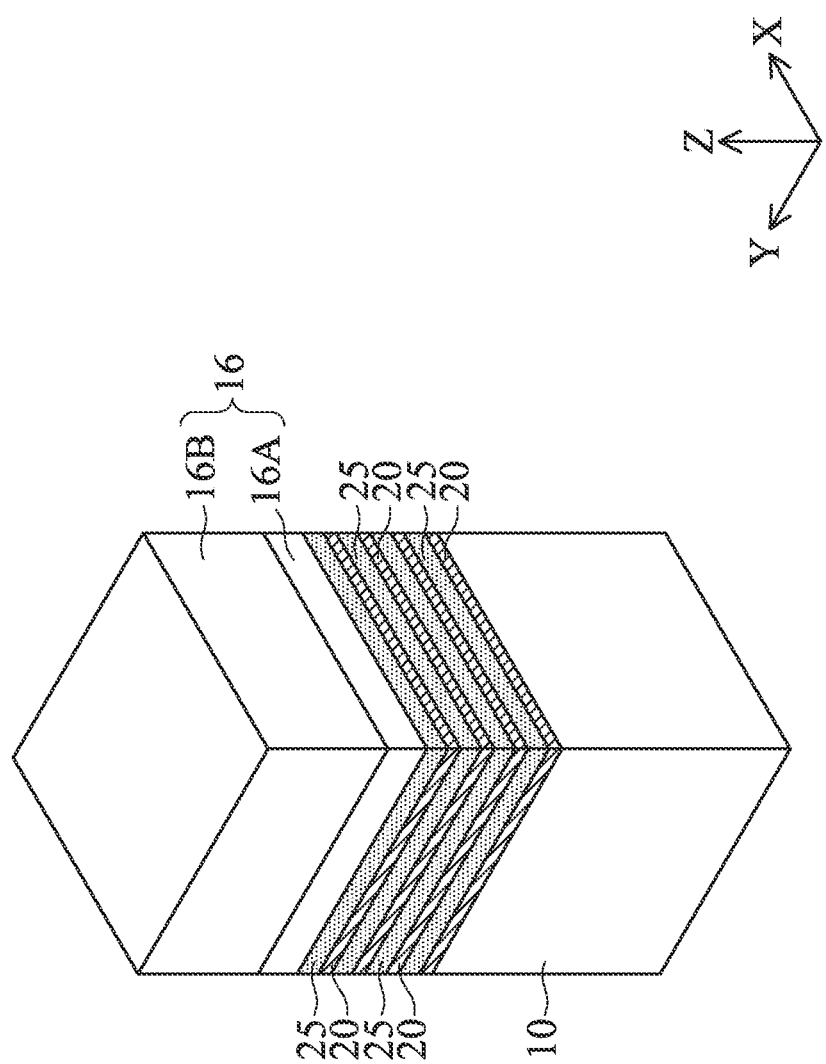

Referring to FIG. 5, at operation 104, the method 100 (FIG. 3A) forms stacked semiconductor layers over the substrate 10. The stacked semiconductor layers include first semiconductor layers 20 and second semiconductor layers 25. Further, a mask layer 16 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-y}Ge_y$, where y is in a range from about 0.1 to about 0.4.

Still referring to FIG. 5, four layers of the first semiconductor layer 20 and four layers of the second semiconductor layer 25 are disposed. However, the number of the layers are not limited to four, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or smaller than that of the second semiconductor layers 25, and is in a range from about 2 nm to about 20 nm in some embodiments, and is in a range from about 5 nm to about 15 nm in other embodiments. The thickness of the second semiconductor layers 25 is in a range from about 2 nm to about 20 nm in some embodiments, and is in a range from about 5 nm to about 15 nm in other embodiments. The thickness of each of the first semiconductor layers 20 may be the same, or may vary. In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 16 includes a first mask layer 16A and a second mask layer 16B. The first mask layer 16A is a pad oxide layer made of a silicon oxide, which can be formed by a thermal oxidation. The second mask layer 16B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 16 is patterned into a mask pattern by using patterning operations including photo-lithography and etching.

Figure 6:
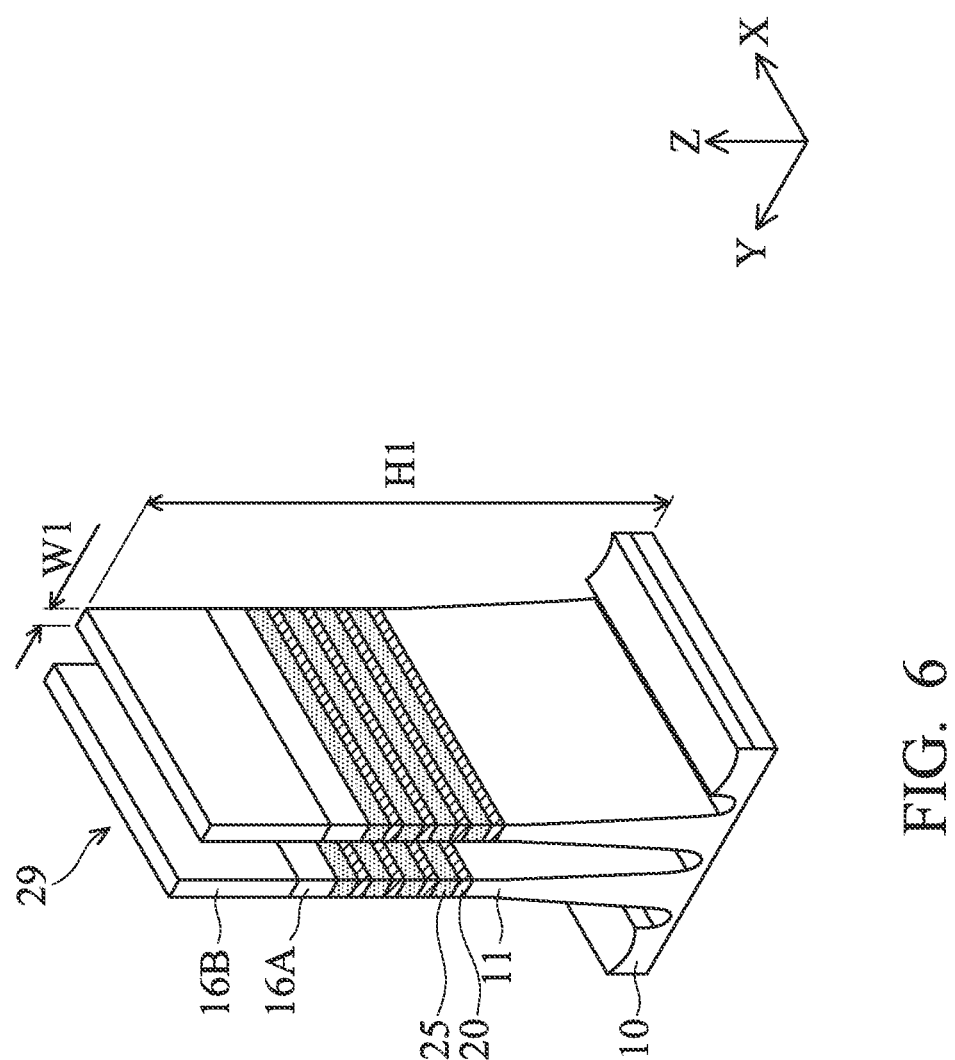

Referring to FIG. 6, at operation 106, the method 100 (FIG. 3A) patterns the stacked layers of the first and second semiconductor layers 20, 25 by using the patterned mask layer 16, thereby the stacked layers are formed into fin structures 29 extending in the X direction. In FIG. 6, two fin structures 29 are arranged in the Y direction. But the number of the fin structures is not limited to two, and may be as small as one and three or more. In some embodiments, one or more dummy fin structures are formed on both sides of the fin structures 29 to improve pattern fidelity in the patterning operations. The fin structures 29 have upper portions constituted by the stacked semiconductor layers 20, 25 and well portions 11. The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

The stacked fin structure 29 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 29.

The method 100 (FIG. 3A) proceeds to operation 108 in forming isolation features on the substrate 10. In some embodiments, after the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, a fin liner layer 13 is formed over the fin structures before forming the insulating material layer. The fin liner layer 13 is made of SiN or a silicon nitride-based material (e.g., SiON, SiCN or SiOCN).

In some embodiments, the fin liner layers 13 include a first fin liner layer formed over the substrate 10 and sidewalls of the bottom part of the fin structures, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Figure 7:
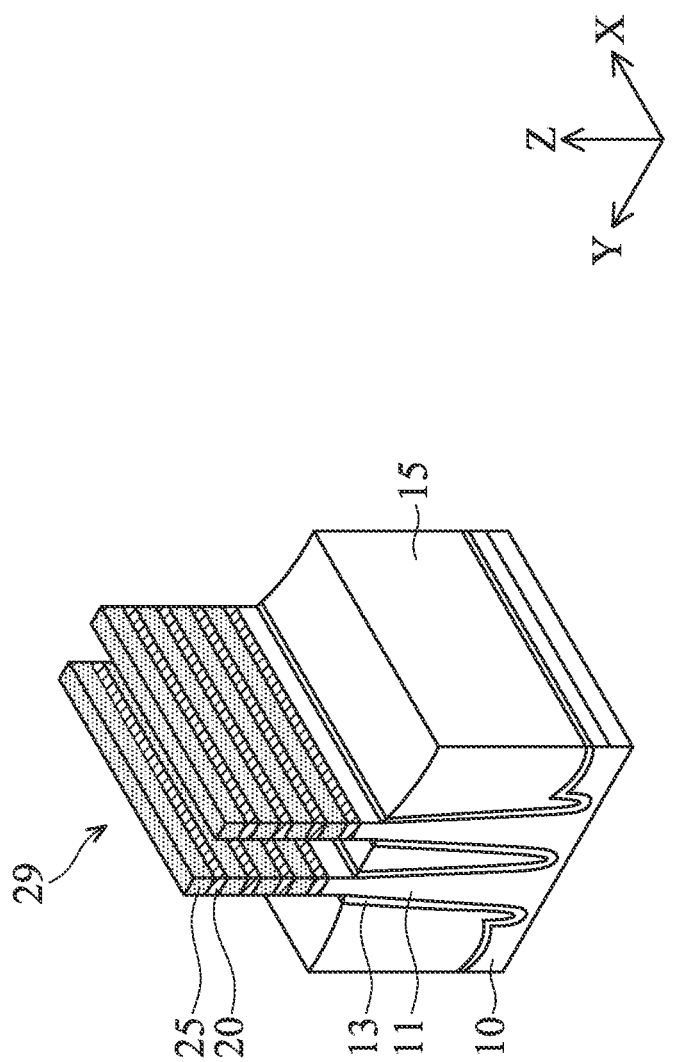

Referring to FIG. 7, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized. In the illustrated embodiment, the insulating material layer 15 is recessed until the upper portion of the fin structure (well portion) 11 is exposed. In other embodiments, the upper portion of the fin structure (well portion) 11 is not exposed. The first semiconductor layers 20 are sacrificial layers which are subsequently partially removed, and the second semiconductor layers 25 are subsequently formed into semiconductor wires as channel layers of a GAA FET.

Figure 8:
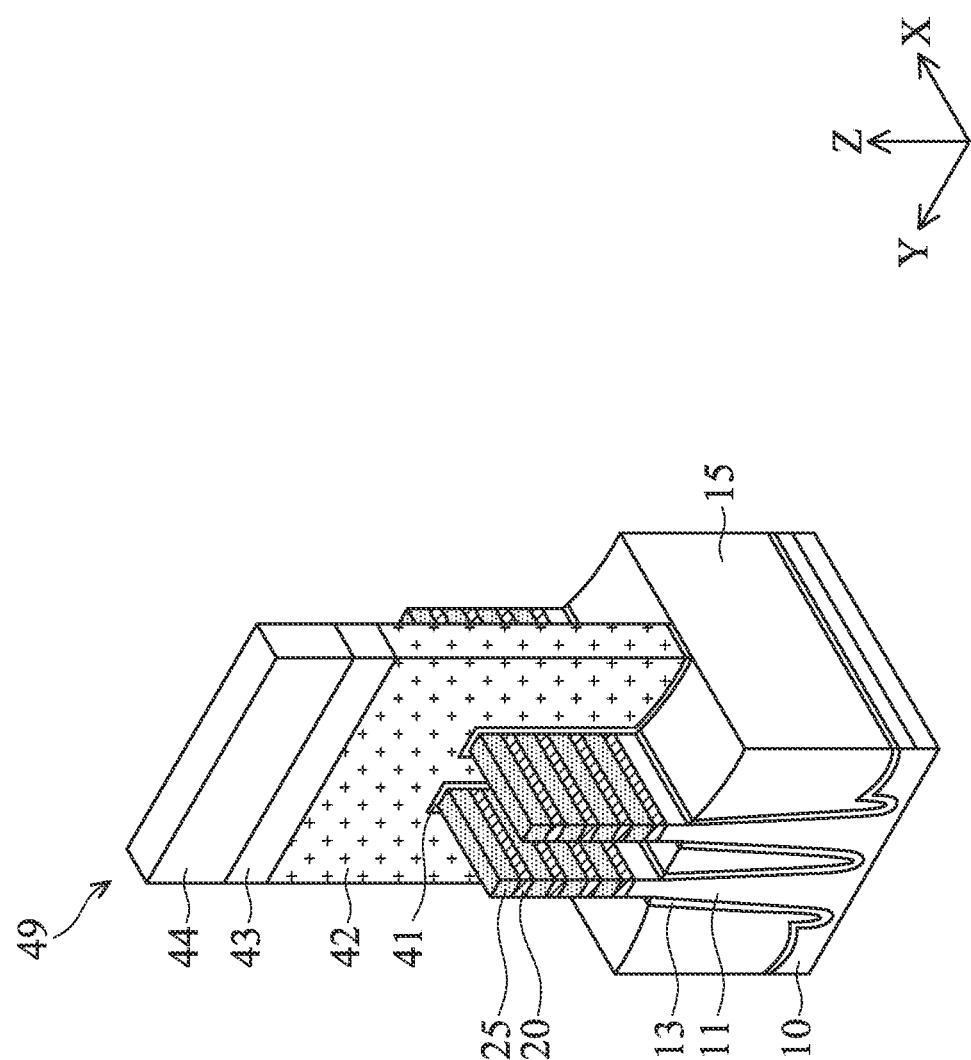

Referring to FIG. 8, at operation 110, the method 100 (FIG. 3A) forms a sacrificial (dummy) gate structure 49. FIG. 8 illustrates a structure after a sacrificial gate structure 49 is formed over the exposed fin structures 29. The sacrificial gate structure 49 is formed over a portion of the fin structures which is to be a channel region. The sacrificial gate structure 49 defines the channel region of the GAA FET. The sacrificial gate structure 49 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 49 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 43 and a silicon oxide mask layer 44.

Next, a patterning operation is performed on the mask layer and sacrificial gate electrode layer is patterned into the sacrificial gate structure 49, as shown in FIG. 8. The sacrificial gate structure includes the sacrificial gate dielectric layer 41, the sacrificial gate electrode layer 42 (e.g., poly silicon), the pad SiN layer 43 and the silicon oxide mask layer 44. By patterning the sacrificial gate structure, the stacked layers of the first and second semiconductor layers are partially exposed on opposite sides of the sacrificial gate structure, thereby defining source/drain (S/D) regions. In this disclosure, a source and a drain are interchangeably used and the structures thereof are substantially the same. In FIG. 8, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 9:
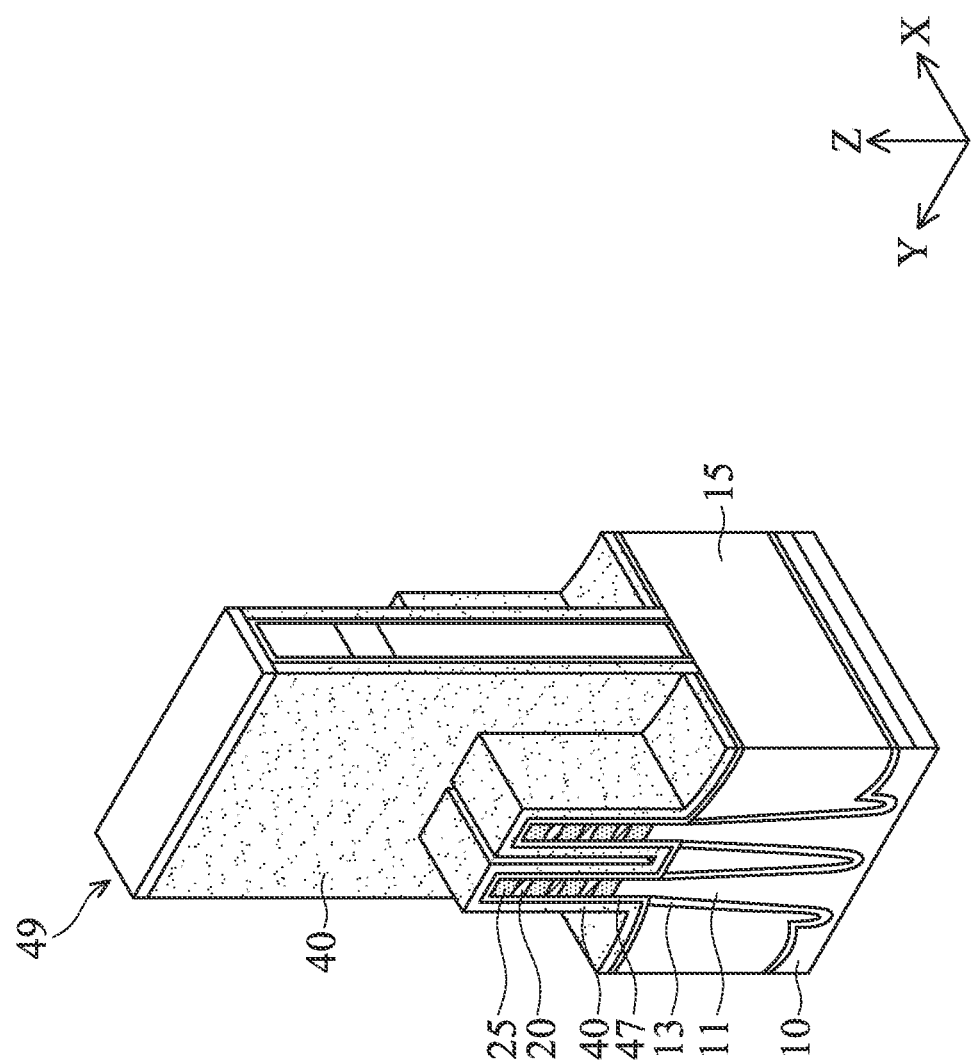
Figure 10A:
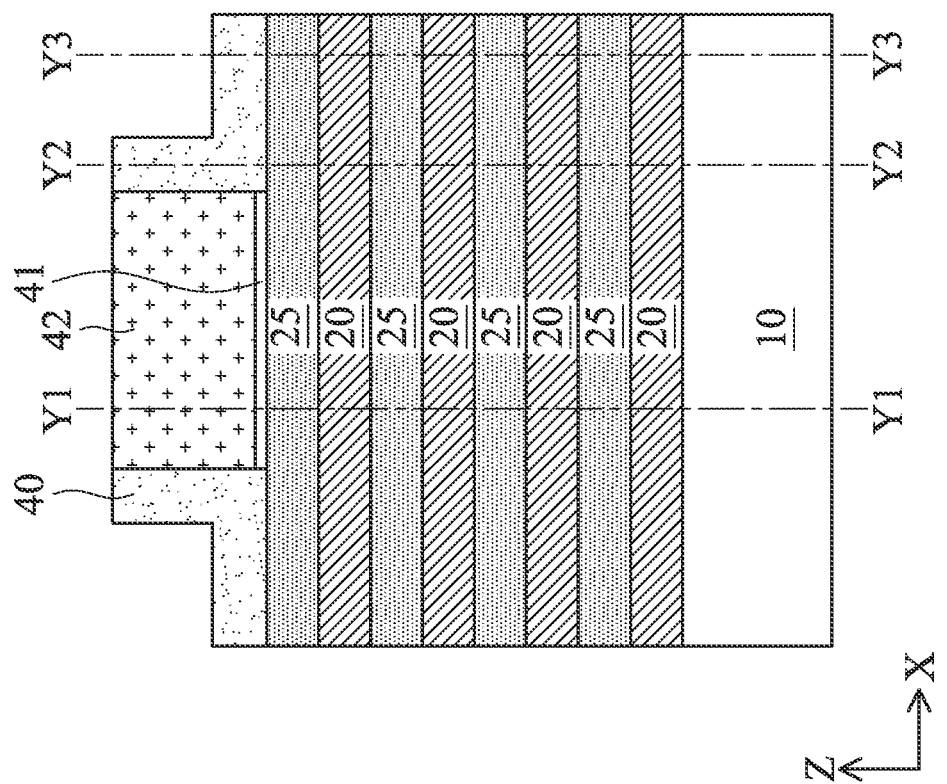
Figure 10D:
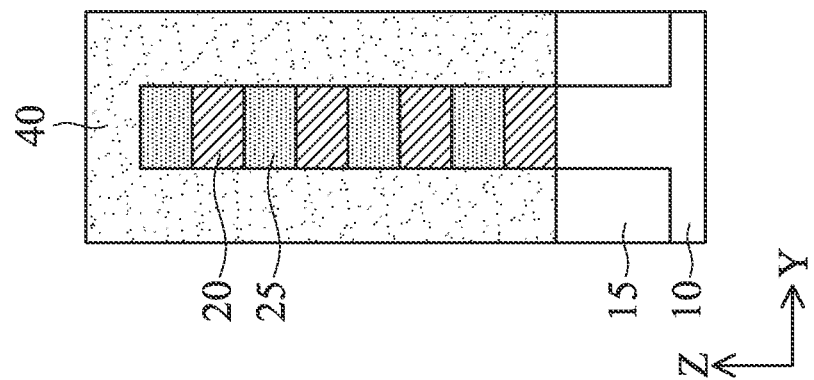
Figure 10C:
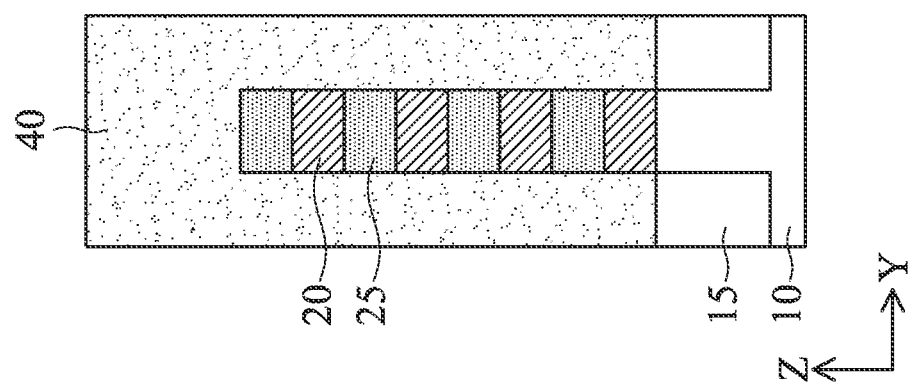
Figure 10B:
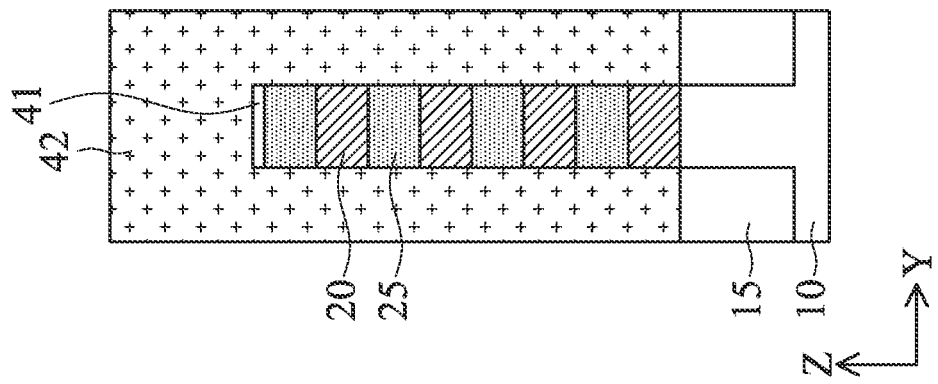
Figure 11A:
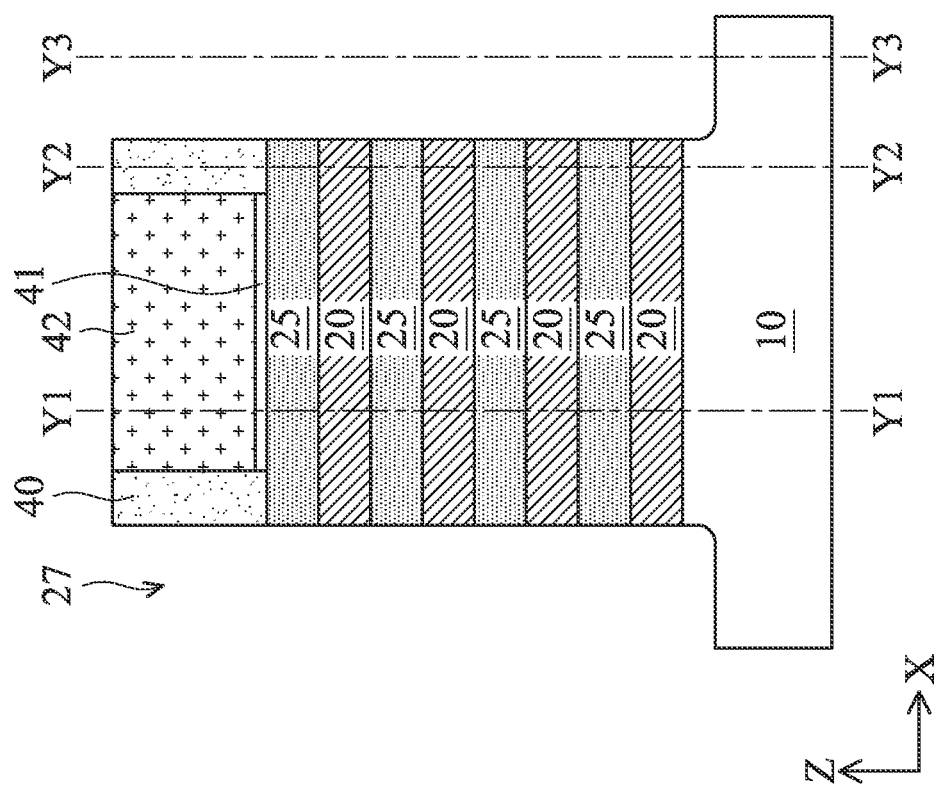
Figure 12A:
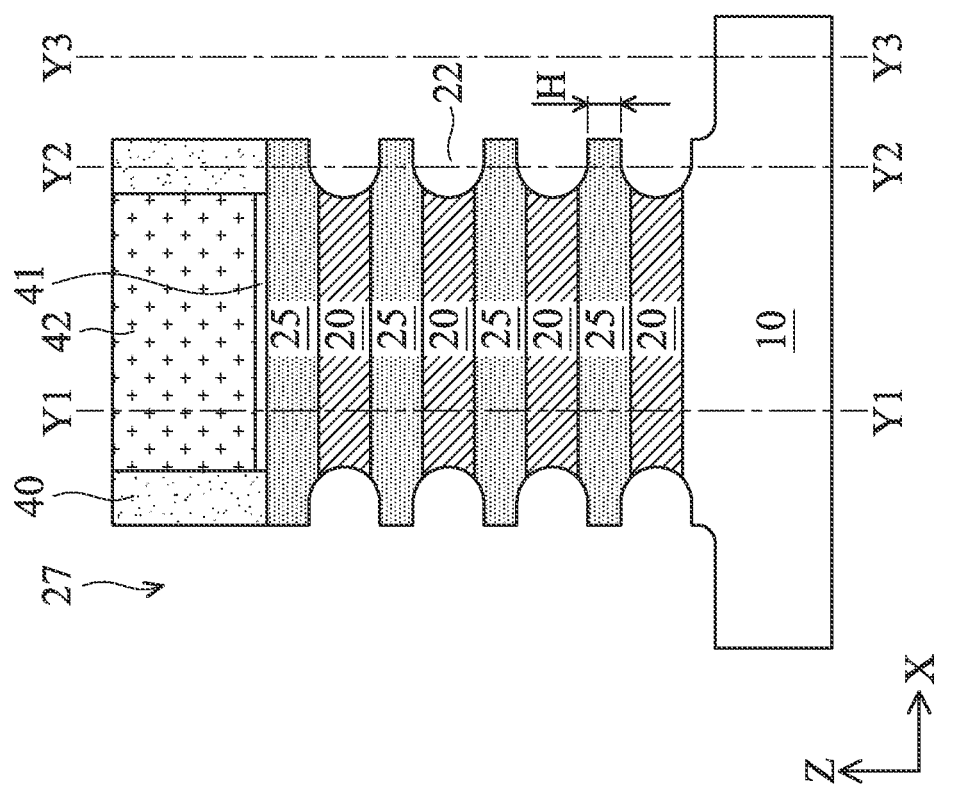
Figure 12B:
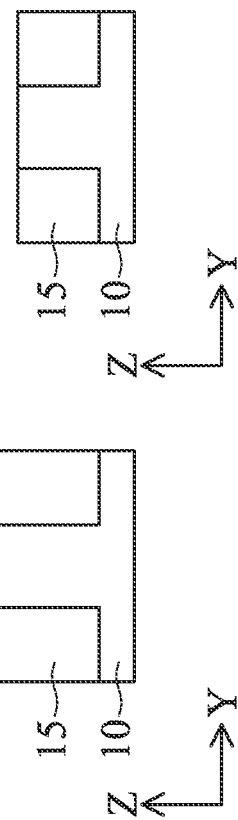
Figure 12C:
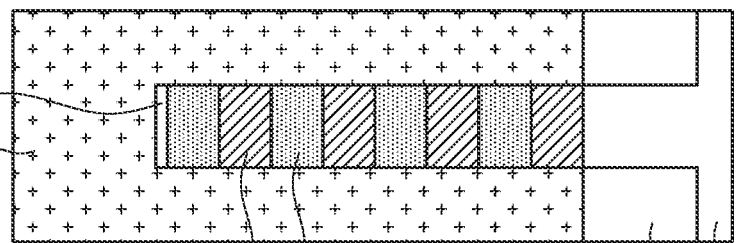
Figure 12D:
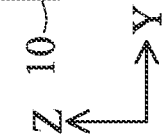
Figure 13A:
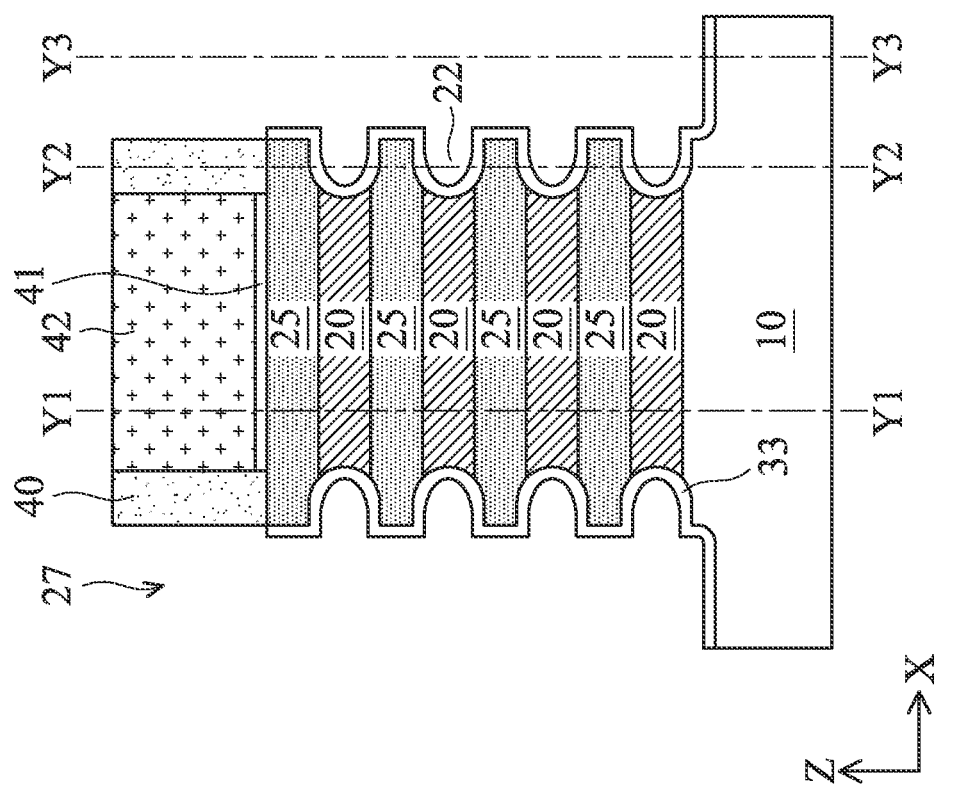
Figure 14A:
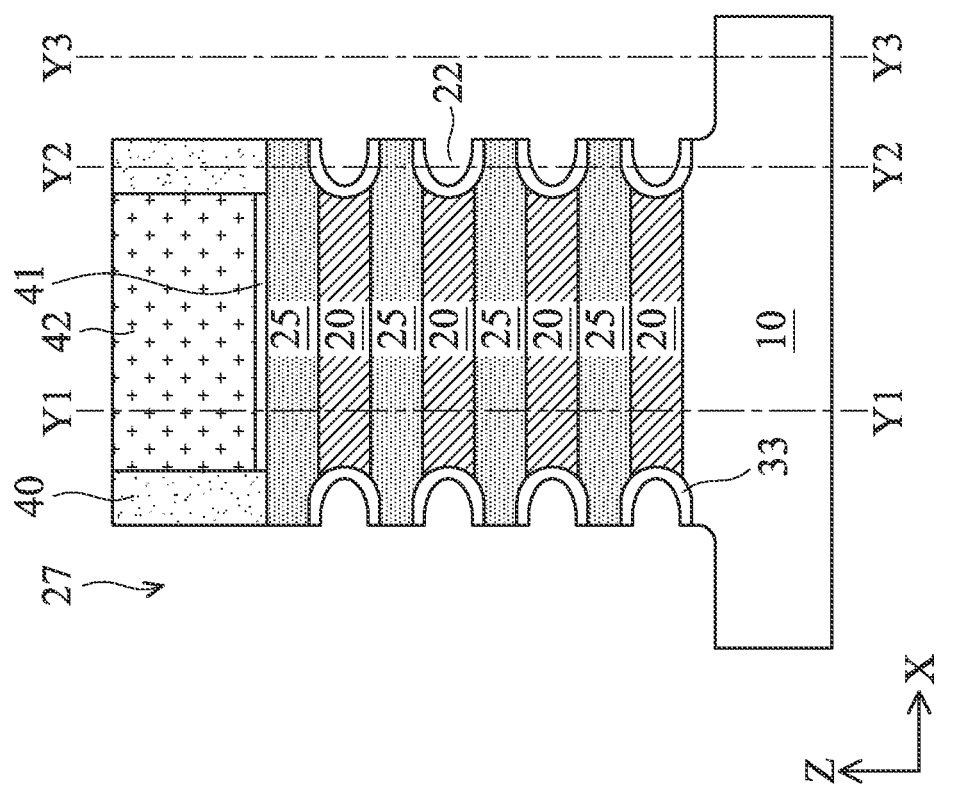
Figure 14B:
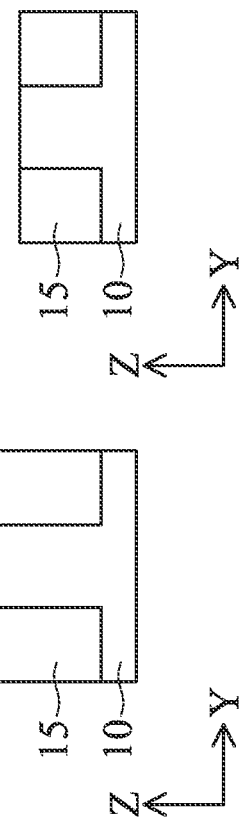
Figure 14C:
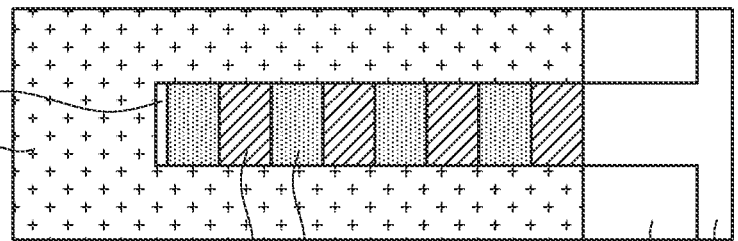
Figure 14D:
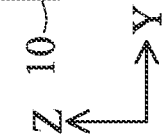
Figure 15A:
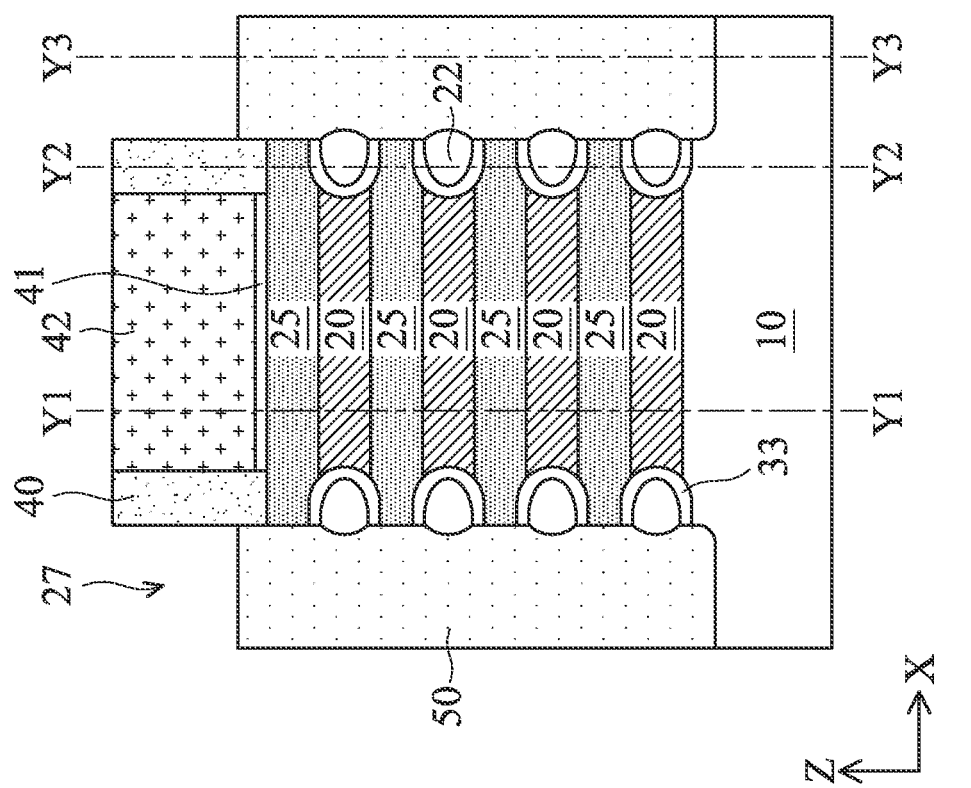
Figures 15B, 15C, 15D:
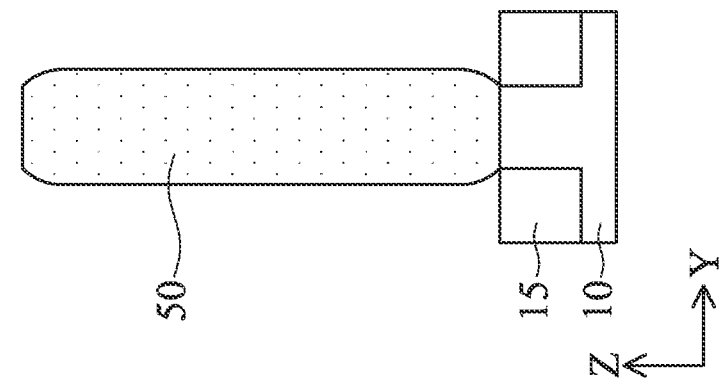
Figure 16A:
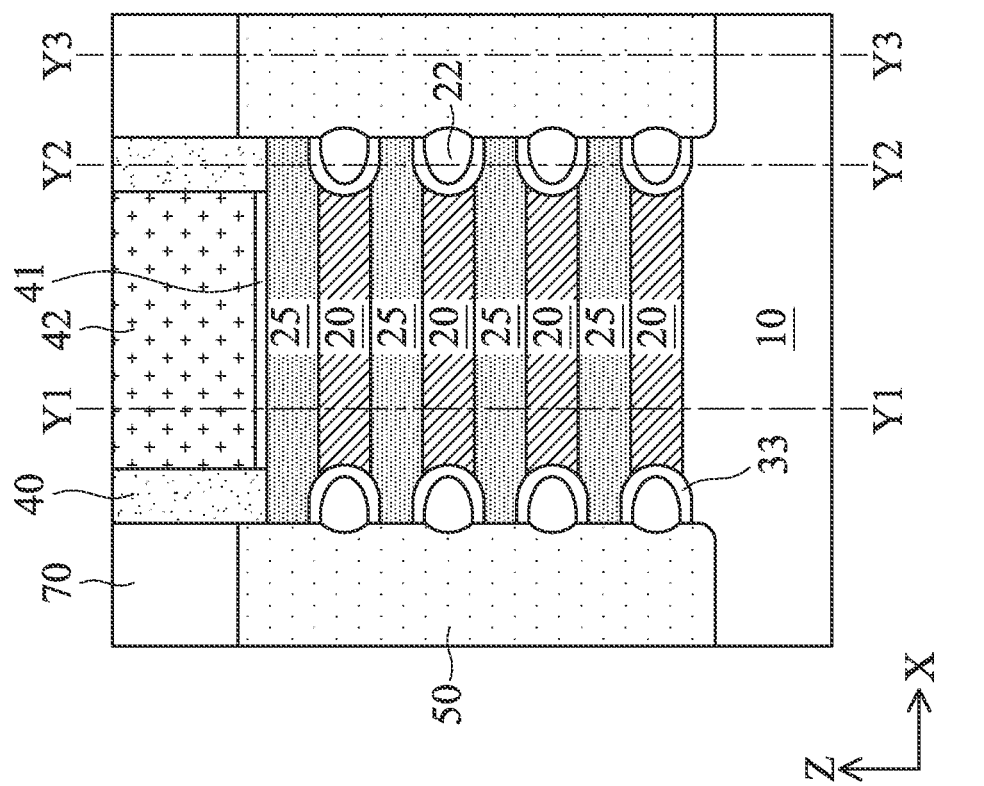
Figure 17A:
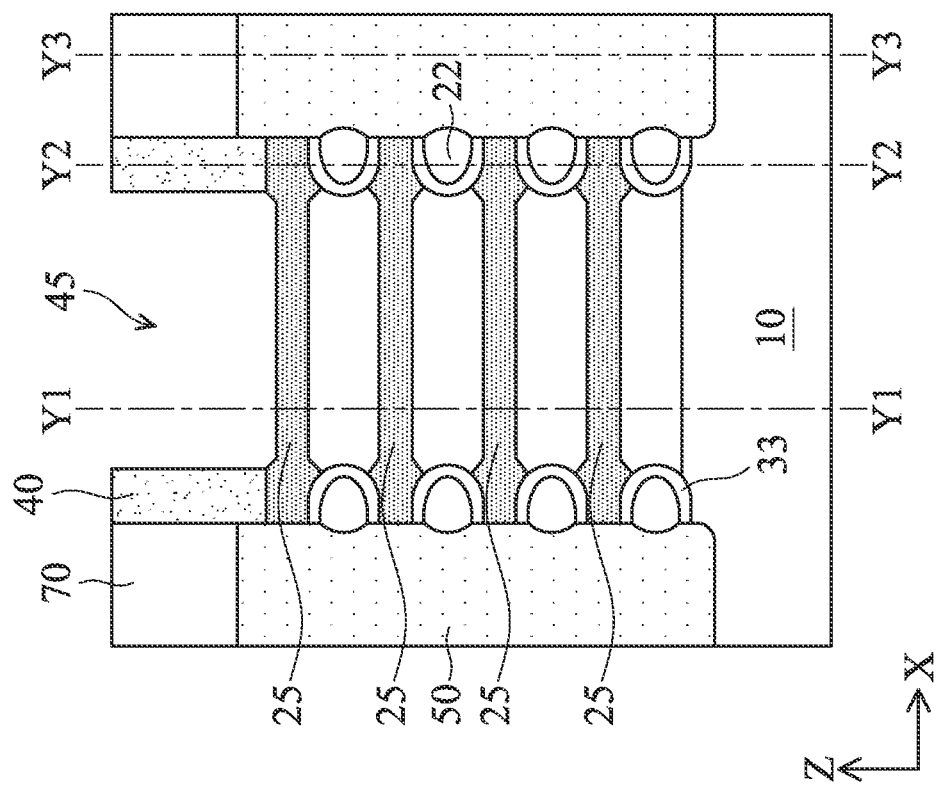
Figure 18A:
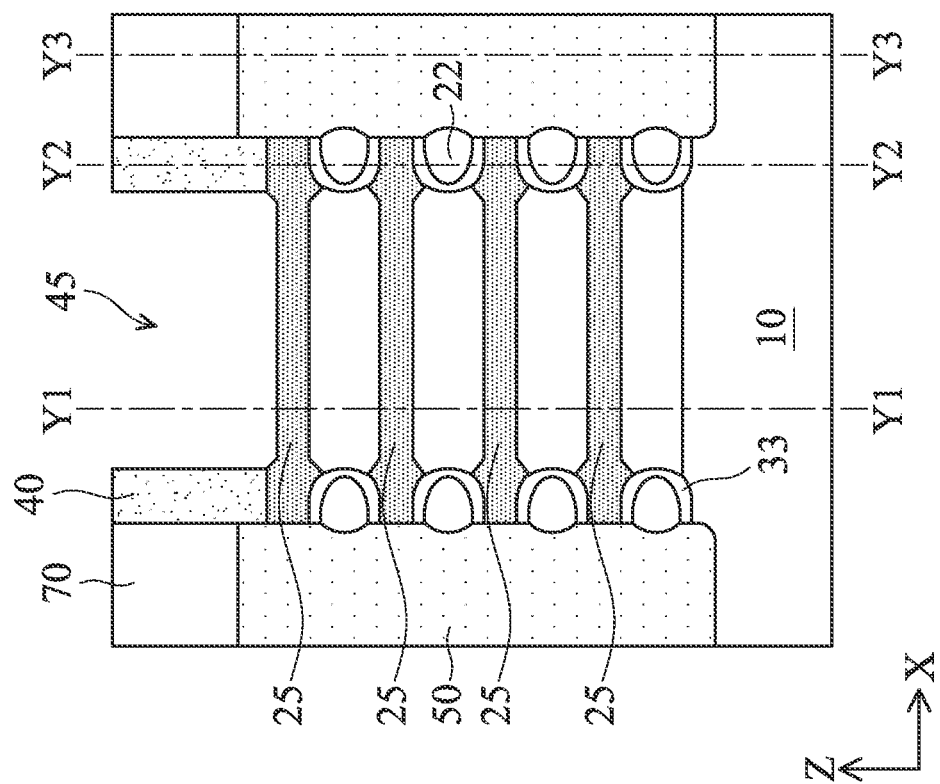
Figure 19A:
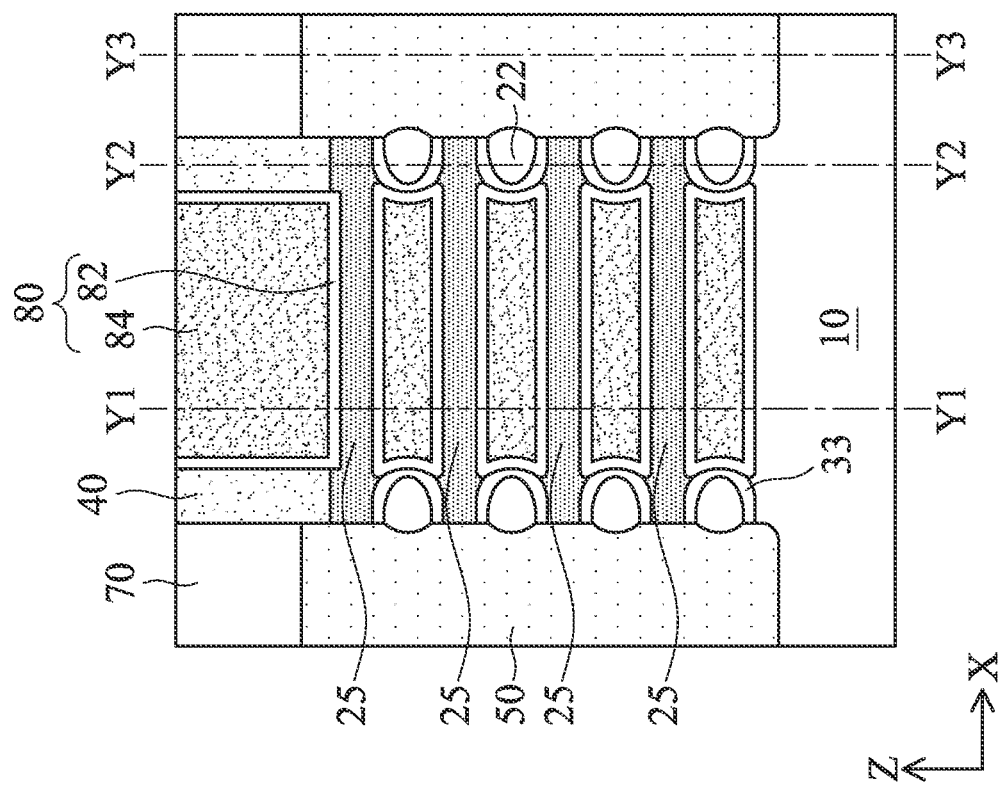
Figures 19B, 19C, 19D:
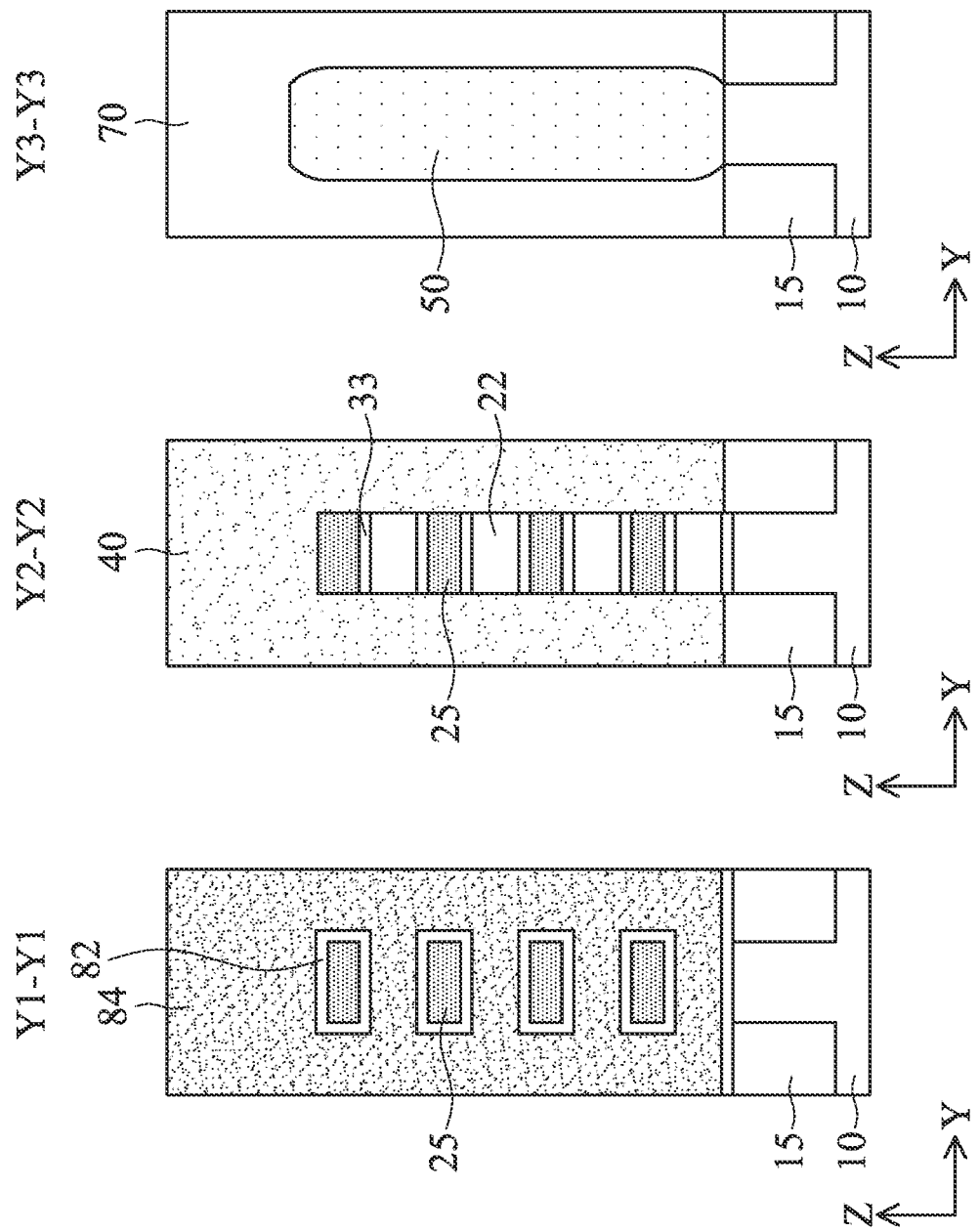
Figure 20A:
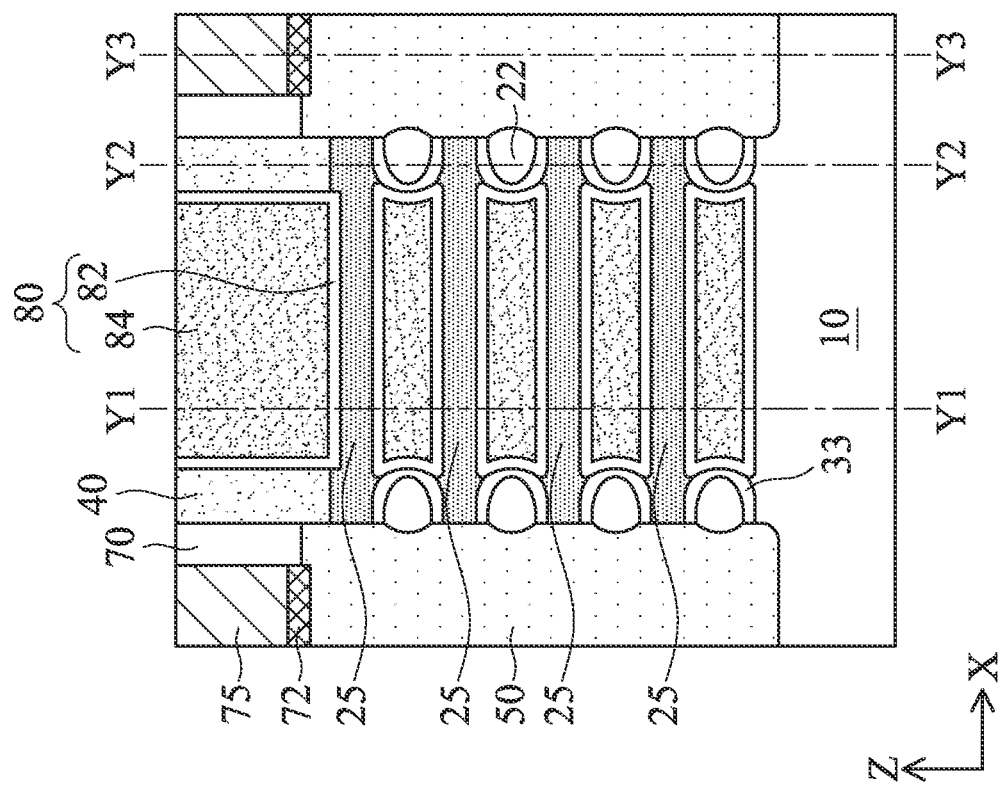

Referring to FIG. 9, at operation 112, the method 100 (FIG. 3A) forms gate spacers. In some embodiments, a cover layer 40 for sidewall spacers is formed over the sacrificial gate structure 49. The cover layer 40 is deposited in a conformal manner so that it is formed to have substantially equal thicknesses on vertical surfaces, such as the sidewalls, horizontal surfaces, and the top of the sacrificial gate structure, respectively. In some embodiments, the cover layer 40 has a thickness greater than the first cover layer and has the thickness in a range from about 5 nm to about 20 nm. The cover layer 40 includes one or more of SiN, SiON and SiCN or any other suitable dielectric material. The cover layer 40 can be formed by ALD or CVD, or any other suitable method.

In certain embodiments, before the cover layer 40 is formed, an additional cover layer 47 made of an insulating material is conformally formed over the exposed fin structures and the sacrificial gate structure 49. In such a case, the additional cover layer and the cover layer are made of different materials so that one of them can be selectively etched. The additional cover layer 47 includes a low-k dielectric material, such as SiOC and/or SiOCN or any other suitable dielectric material and can be formed by ALD or CVD, or any other suitable method.

By the operations explained with FIGS. 4-9, the structure of FIGS. 10A-10D can be obtained. In FIGS. 10A-10D, the upper portion of the sacrificial gate structure and the additional cover layer 47 are not shown.

Next, referring to FIGS. 11A-11D, at operation 114, the method 100 (FIG. 3A) etches the stacked structure of the first semiconductor layers 20 and the second semiconductor layer 25 down at the S/D region, by using one or more lithography and etching operations, thereby forming an S/D trench 27. In some embodiments, the substrate 10 (or the bottom part of the fin structures) is also partially etched.

Referring to FIGS. 12A-12D, at operation 116, the method 100 (FIG. 3A) laterally etches the first semiconductor layers 20 in the X direction through the S/D trench 27, thereby forming cavities (or recesses) 22. The amount of etching of the first semiconductor layer 20 is in a range from about 2 nm to about 5 nm in some embodiments. When the first semiconductor layers 20 are Ge or SiGe and the second semiconductor layers 25 are Si, the first semiconductor layers 20 can be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. The lateral etching of the first semiconductor layers 20 may also remove a small portion of the second semiconductor layers 25. As a result, lateral ends of the semiconductor layers 25 that are exposed in the cavities 22 have a smaller thickness than other portions of the semiconductor layers 25 that are under the sacrificial gate structure and not exposed in the cavities 22. A distance H between adjacent stacked cavities 22 ranges from about 5 nm to about 9 nm, in some embodiments.

In the illustrated embodiments, the cavities 22 have a dome-shape profile. The apex of the dome-shape profile is directly under the gate spacer 40 in some embodiments, or alternatively extends to a position directly under the sacrificial gate structure in some other embodiments. By selecting an appropriate crystal orientation of the first semiconductor layers 20 and an etchant, the etched surface of the lateral ends of the first semiconductor layers 20 may have profile other than a dome shape, such as a rectangular-shape cavity, a triangular-shape cavity, or an open-octangle-shape cavity with facets of different crystalline orientations (see Examples II-IV in FIG. 2C).

Referring to FIGS. 13A-13D, at operation 118, the method 100 (FIG. 3B) selectively deposits an insulating layer 33 on semiconductor materials, more specifically, on surfaces of the first semiconductor layer 20 and the second semiconductor layer 25 that are exposed in the S/D trench 27 and the cavities 22, and also on top surface of the substrate 10 that is exposed in the S/D trench 27. The insulating layer 33 is not deposited on dielectric materials, such as not on the dielectric sidewalls of the gate spacer 40. In an embodiment, the insulating layer 33 is deposited on semiconductor surfaces due to covalent bonds between the molecules of the semiconductor material and the molecules of the insulating layer 33. Such covalent bonds do not exist between the dielectric sidewalls of the gate spacer 40. Thus, the insulating layer 33 is not deposited over these dielectric surfaces. In the Y-Z plane (see FIG. 13C), portions of the gate spacer 40 are still exposed in the cavities 22 and not covered by the insulating layer 33. In the illustrated embodiment, the insulating layer 33 is conformally deposited. The term "conformally" may be used herein for ease of description upon a layer having substantial same thickness over various regions. By conformally forming the insulating layer 33, the size of the cavities 22 is reduced. The insulating layer 33 can be formed by selective ALD process or any other suitable method.

Referring to FIGS. 14A-14D, at operation 120, the method 100 (FIG. 3A) performs an etching process to partially remove vertical portions of the insulating layer 33 from outside of the cavities 22. In some embodiments, the etching process is an anisotropic etching. The etching process also removes portions of the insulating layer 33 from top surface of the substrate 10. By this etching, the insulating layer 33 remains substantially within the cavities 22. Generally, plasma dry etching etches a layer in wide and flat areas faster than a layer in concave (e.g., holes, grooves and/or slits) portions. Thus, the insulating layer 33 can remain inside the cavities 22. After the etching process, terminal ends of the second semiconductor layer 25 are exposed in the S/D trench 27, while terminal ends of the first semiconductor layer 20 remains covered by the insulating layer 33. In furtherance of some embodiments, end portions (edges) of the insulating layer 33 under the gate spacer 40 substantially flush with end portions (edges) of the second semiconductor layer 25 (and also with outer sidewall of the gate spacer 40).

Subsequently, referring to FIGS. 15A-15D, at operation 122, the method 100 (FIG. 3B) forms an S/D epitaxial feature 50 in the S/D trench 27. The S/D epitaxial feature 50 includes one or more layers of Si, SiP, SiC and SiCP for an n-channel FET or Si, SiGe, Ge for a p-channel FET. For the P-channel FET, boron (B) may also be contained in the source/drain. The S/D epitaxial feature 50 is formed by an epitaxial growth method using CVD, ALD or molecular beam epitaxy (MBE). As shown in FIGS. 15A-15D, the S/D epitaxial feature 50 is formed in contact with the second semiconductor layers 25 and the insulating layer 33, sealing the cavities 22, thereby resulting in air gaps trapped in the place of the cavities 22. The air gaps reduce the overall effective dielectric constant of the inner spacers 31. After operation 122, the sealed cavities 22 are referred to as air gaps 22. As discussed above in association with FIGS. 2A-2B, the epitaxial growth rate of the S/D epitaxial feature can be tuned to determine lateral size of the air gaps 22.

Referring to FIGS. 16A-16D, at operation 124, the method 100 (FIG. 3B) forms an interlayer dielectric (ILD) layer 70 over the S/D epitaxial feature 50. The materials for the ILD layer 70 include compounds comprising Si, 0, C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed.

Referring to FIGS. 17A-17D, at operation 126, the method 100 (FIG. 3B) removes the sacrificial gate electrode layer 42 and sacrificial gate dielectric layer 41 to form a gate trench 45. The ILD layer 70 protects the S/D epitaxial feature 50 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

Still referring to FIGS. 17A-17D, at operation 128, the method 100 (FIG. 3B) removes the first semiconductor layers 20, thereby forming channel members (e.g., nanowires or nanosheet) of the second semiconductor layers 25. The first semiconductor layers 20 can be removed or etched using an etchant that can selectively etch the first semiconductor layers 20 against the second semiconductor layers 25, as set forth above. Since the high-k insulating layer 33 is formed, the etching of the first semiconductor layers 20 stops at the insulating layer 33, exposing the insulating layer 33 in the gate trench. In other words, the insulating layer 33 functions as an etch-stop layer for avoiding etching through the inner spacer region. The insulating layer 33 makes it possible to more precisely control the thickness, the shape, and/or the locations of the inner spacers in different layers and thus to control capacitances around the source/drain and the gate. In some embodiments, the etchant used in removing the first semiconductor layers 20 is selected such that it also has some etching rate on the insulating layer 33, resulting in a reduced thickness of the portion of the insulating layer 33 exposed in the gate trench 45. The etching process also removes a portion of the second semiconductor layers 25 exposed in the gate trench 45. The removal of the portion of the second semiconductor layers 25 exposed in the gate trench 45 results in three portions of the second semiconductor layers 25 with different thicknesses. The first portion is the lateral ends under the gate spacer 40 with a first reduced thickness due to the forming of the cavities 22, the second portion is the center portion of the second semiconductor layers 25 with a second reduced thickness due to the removing of the first semiconductor layers 20 from the gate trench 45, the third portion is the transitional portion between the first portion and the second portion with substantially the original thickness that is larger than either the first reduced thickness or the second reduced thickness. In the illustrated embodiment, the first reduced thickness is larger than the second reduced thickness. In some other embodiments, the first reduced thickness is smaller than the second reduced thickness.

Referring to FIGS. 18A-18D, at operation 130, the method 100 (FIG. 3B) may optionally perform another etching process to further thin down the portion of the insulating layer 33 exposed in the gate trench 45. The thinning process removes extra high-k dielectric material from the insulating layer 33 and further reduces effective dielectric constant of the inner spacers. The reduced thickness can be tuned by controlling etching duration. In some embodiments, a reduced thickness of the insulating layer 33 is less than 1 nm. The other portions of the insulating layer 33 disposed on lateral ends of the second semiconductor layers 25 remains intact. The etching process may include a wet etching, a dry etching, or a combination thereof.

Referring to FIGS. 19A-19D, at operation 132, the method 100 (FIG. 3B) forms a gate dielectric layer 82 wrapping around each channel member and a gate electrode layer 84 on the gate dielectric layer 82. In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer (not shown) formed between the channel layers and the dielectric material. The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

The gate electrode layer 84 is formed on the gate dielectric layer 82 to surround each channel layer. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 84 may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode layer 84. The cap insulating layer includes one or more layers of a silicon nitride-based material, such as SiN. The cap insulating layer can be formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Referring to FIGS. 20A-20D, the method 100 proceeds to form various features and regions known in the art. For example, contact holes are formed in the ILD layer 70 by using dry etching, thereby exposing the upper portion of the S/D epitaxial feature 50. In some embodiments, a silicide layer is formed over the S/D epitaxial feature 50. The silicide layer includes one or more of WSi, CoSi, NiSi, TiSi, MoSi and TaSi. Then, a conductive contact layer 72 is formed in the contact holes. The conductive contact layer 72 includes one or more of Co, Ni, W, Ti, Ta, Cu, Al, TiN and TaN. Further, a conductive contact plug 75 is formed on the conductive contact layer 72. The conductive contact plug 75 includes one or more layers of Co, Ni, W, Ti, Ta, Cu, Al, TiN and TaN. Subsequent processing may form multilayers interconnect features (e.g., metal layers and interlayer dielectrics) configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. For example, embodiments of the present disclosure provide inner spacers with at least an air gap and an insulating layer. The insulating layer makes it possible to more precisely control the thickness, the shape, and/or the locations of the inner spacers. The air gap reduces effective dielectric constant of the inner spacer and thus reduces capacitances around the source/drain and the gate. Furthermore, the inner spacer formation method can be easily integrated into existing semiconductor fabrication processes.

In one exemplary aspect, the present disclosure is directed to a method of manufacturing a semiconductor device. The method includes a method of manufacturing a semiconductor device. The method includes forming a fin structure in which first semiconductor layers and second semiconductor layers are alternatively stacked, the first and second semiconductor layers having different material compositions; forming a sacrificial gate structure over the fin structure; forming a gate spacer on sidewalls of the sacrificial gate structure; etching a source/drain (S/D) region of the fin structure, which is not covered by the sacrificial gate structure and the gate spacer, thereby forming an S/D trench; laterally etching the first semiconductor layers through the S/D trench, thereby forming recesses; selectively depositing an insulating layer on surfaces of the first and second semiconductor layers exposed in the recesses and the S/D trench, but not on sidewalls of the gate spacer; and growing an S/D epitaxial feature in the S/D trench, thereby trapping air gaps in the recesses. In some embodiments, the air gaps are laterally between the S/D epitaxial feature and the insulating layer. In some embodiments, the insulating layer has a dielectric constant higher than the gate spacer. In some embodiments, the insulating layer comprises silicon, oxygen, carbon, and nitrogen. In some embodiments, the method further includes performing an anisotropic etching process to remove vertical portions of the insulating layer from the S/D trench, wherein other portions of the insulating layer in the recesses remain. In some embodiments, where a portion of the insulating layer in the recesses is in contact with lateral ends of the first semiconductor layers, the method further includes performing an etching process to reduce a thickness of the portion of the insulating layer. In some embodiments, the method further includes removing the sacrificial gate structure, thereby forming a gate trench; and etching the first semiconductor layers from the gate trench, thereby exposing a portion of the insulating layer in the gate trench, wherein the etching of the first semiconductor layers also reduce a thickness of the portion of the insulating layer. In some embodiments, the method further includes removing the sacrificial gate structure, thereby forming a gate trench; performing a first etching process, thereby removing the first semiconductor layers from the gate trench and exposing a portion of the insulating layer in the gate trench; and performing a second etching process to reduce a thickness of the portion of the insulating layer. In some embodiments, the growing of the S/D epitaxial feature includes controlling a growth rate of the S/D epitaxial feature, such that the S/D epitaxial feature has concave surfaces exposed in the air gaps and extending away from lateral ends of the first semiconductor layers. In some embodiments, the growing of the S/D epitaxial feature includes controlling a growth rate of the S/D epitaxial feature, such that the S/D epitaxial feature has convex surfaces exposed in the air gaps and extending towards lateral ends of the first semiconductor layers.

In another exemplary aspect, the present disclosure is directed to a method of fabricating a semiconductor device. The method includes forming a stack of first type and second type epitaxial layers on a semiconductor substrate, the first type and second type epitaxial layers having different material compositions and being alternatingly disposed in a vertical direction; patterning the stack to form a fin structure; forming a sacrificial gate structure over the fin structure; removing at least the first type epitaxial layers from a source/drain (S/D) region of the fin structure, which is not covered by the sacrificial gate structure; forming an insulating layer on lateral ends of the first type epitaxial layers; forming an S/D epitaxial feature in contact with the insulating layer and the second type epitaxial layers, wherein the insulating layer interposes the S/D epitaxial feature and the first type epitaxial layers, and wherein the S/D epitaxial feature traps air gaps laterally between the S/D epitaxial feature and the insulating layer; removing the sacrificial gate structure and the first type epitaxial layers, resulting in a gate trench; and partially etching a portion of the insulating layer exposed in the gate trench. In some embodiments, the insulating layer has a dielectric constant larger than 5. In some embodiments, the insulating layer includes silicon carbon oxynitride. In some embodiments, after the partially etching of the portion of the insulating layer, the portion of the insulating layer exposed in the gate trench has a thickness less than other portions of the insulating layer in contact with the second type epitaxial layers. In some embodiments, the method further includes forming a metal gate stack in the gate trench, wherein the insulating layer interposes the metal gate stack and the air gaps. In some embodiments, the method further includes forming a gate spacer on sidewalls of the sacrificial gate structure, wherein a portion of the gate spacer is exposed in the air gaps.

In yet another exemplary aspect, the present disclosure is directed to a semiconductor device. The semiconductor device includes semiconductor channel members vertically stacked over a substrate; a gate stack wrapping around the semiconductor channel members; a gate spacer disposed on sidewalls of the gate stack; a source/drain (S/D) epitaxial feature in contact with the semiconductor channel members; and an insulating layer interposing the S/D epitaxial feature and the gate stack, wherein the insulating layer, the S/D epitaxial feature, and the gate spacer collectively define air gaps stacked between adjacent semiconductor channel members. In some embodiments, the insulating layer has a higher dielectric constant than the gate spacer. In some embodiments, the insulating layer has a first portion in contact with the semiconductor channel members and a second portion in contact with the gate stack, wherein the first portion has a thickness larger than the second portion. In some embodiments, a portion of the S/D epitaxial feature interfacing the air gaps has a concave surface bending away from the gate stack.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure in which first semiconductor layers and second semiconductor layers are alternatively stacked, the first and second semiconductor layers having different material compositions;
    forming a sacrificial gate structure over the fin structure;
    forming a gate spacer on sidewalls of the sacrificial gate structure;
    etching a source/drain (S/D) region of the fin structure, which is not covered by the sacrificial gate structure and the gate spacer, thereby forming an S/D trench;
    laterally etching the first semiconductor layers through the S/D trench, thereby forming recesses;
    selectively depositing an insulating layer on surfaces of the first and second semiconductor layers exposed in the recesses and the S/D trench, but not on sidewalls of the gate spacer;
    performing an anisotropic etching process to remove at least some vertical portions of the insulating layer from the S/D trench, wherein other portions of the insulating layer in the recesses remain; and
    growing an S/D epitaxial feature in the S/D trench, thereby trapping air gaps in the recesses.

2. The method of claim 1, wherein the air gaps are laterally between the S/D epitaxial feature and the insulating layer.

3. The method of claim 1, wherein the insulating layer has a dielectric constant higher than the gate spacer.

4. The method of claim 1, wherein the insulating layer comprises silicon, oxygen, carbon, and nitrogen.

5. The method of claim 1, wherein a portion of the insulating layer in the recesses is in contact with lateral ends of the first semiconductor layers, further comprising:
    performing an etching process to reduce a thickness of the portion of the insulating layer.

6. The method of claim 1, further comprising:
    removing the sacrificial gate structure, thereby forming a gate trench; and
    etching the first semiconductor layers from the gate trench, thereby exposing a portion of the insulating layer in the gate trench, wherein the etching of the first semiconductor layers also reduces a thickness of the portion of the insulating layer.

7. The method of claim 1, further comprising:
    removing the sacrificial gate structure, thereby forming a gate trench;
    performing a first etching process, thereby removing the first semiconductor layers from the gate trench and exposing a portion of the insulating layer in the gate trench; and
    performing a second etching process to reduce a thickness of the portion of the insulating layer.

8. The method of claim 1, wherein the growing of the S/D epitaxial feature includes controlling a growth rate of the S/D epitaxial feature, such that the S/D epitaxial feature has concave surfaces exposed in the air gaps and extending away from lateral ends of the first semiconductor layers.

9. The method of claim 1, wherein the growing of the S/D epitaxial feature includes controlling a growth rate of the S/D epitaxial feature, such that the S/D epitaxial feature has convex surfaces exposed in the air gaps and extending towards lateral ends of the first semiconductor layers.

10. The method of claim 1, wherein the insulating layer comprises a metal oxide.

11. A method of manufacturing a semiconductor device, comprising:
    forming a stack of first type and second type epitaxial layers on a semiconductor substrate, the first type and second type epitaxial layers having different material compositions and being alternatingly disposed in a vertical direction;
    patterning the stack to form a fin structure;
    forming a sacrificial gate structure over the fin structure;
    removing at least the first type epitaxial layers from a source/drain (S/D) region of the fin structure, which is not covered by the sacrificial gate structure;
    forming an insulating layer on lateral ends of the first type epitaxial layers;
    forming an S/D epitaxial feature in contact with the insulating layer and the second type epitaxial layers, wherein the insulating layer interposes the S/D epitaxial feature and the first type epitaxial layers, and wherein the S/D epitaxial feature traps air gaps laterally between the S/D epitaxial feature and the insulating layer;
    removing the sacrificial gate structure and the first type epitaxial layers, resulting in a gate trench; and
    partially etching a portion of the insulating layer exposed in the gate trench.

12. The method of claim 11, wherein the insulating layer has a dielectric constant larger than 5.

13. The method of claim 11, wherein the insulating layer includes silicon carbon oxynitride.

14. The method of claim 11, wherein after the partially etching of the portion of the insulating layer, the portion of the insulating layer exposed in the gate trench has a thickness less than other portions of the insulating layer in contact with the second type epitaxial layers.

15. The method of claim 11, further comprising:
forming a metal gate stack in the gate trench, wherein the insulating layer interposes the metal gate stack and the air gaps.

16. The method of claim 11, further comprising:
forming a gate spacer on sidewalls of the sacrificial gate structure, wherein a portion of the gate spacer is exposed in the air gaps.

17. A method of manufacturing a semiconductor device, comprising:
forming a fin structure in which first semiconductor layers and second semiconductor layers are alternatively stacked, the first and second semiconductor layers having different material compositions;
forming a sacrificial gate structure over the fin structure;
forming a gate spacer on sidewalls of the sacrificial gate structure;
etching a region of the fin structure not covered by the sacrificial gate structure and the gate spacer, thereby forming a trench;
laterally etching the first semiconductor layers through the trench, thereby forming recesses;
depositing an insulating layer on surfaces of the first and second semiconductor layers exposed in the recesses;
growing an epitaxial feature in the trench, thereby trapping at least an air gap in one of the recesses;
removing the sacrificial gate structure, thereby forming a gate trench;
removing the first semiconductor layers from the gate trench to expose a first portion of the insulating layer in the gate trench; and
forming a metal gate stack in the gate trench and in contact with the first portion of the insulating layer,
wherein the insulating layer includes a second portion in contact with the epitaxial feature, and a thickness of the second portion is larger than a thickness of the first portion.

18. The method of claim 17, wherein the second portion of the insulating layer extends vertically along a sidewall of the epitaxial feature.

19. The method of claim 17, wherein the air gap has a dome shape.

20. The method of claim 17, wherein a ratio of a dielectric constant of the insulating layer over a dielectric constant of the gate spacer ranges from about 1.5 to about 3.

* * * * *